US009190160B2

(12) United States Patent
Ok et al.

(10) Patent No.: US 9,190,160 B2
(45) Date of Patent: Nov. 17, 2015

(54) MEMORY DEVICE HAVING VARIABLE READ VOLTAGE AND RELATED METHODS OF OPERATION

(71) Applicant: SAMSUNG ELECTRONICS CO., LTD., Suwon-si, Gyeonggi-do (KR)

(72) Inventors: Dong-Ju Ok, Busan (KR); Hye-Ry No, Seoul (KR); Kyoung-Lae Cho, Suwon-si (KR); Sue-Jin Kim, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 143 days.

(21) Appl. No.: 13/948,431

(22) Filed: Jul. 23, 2013

(65) Prior Publication Data
US 2014/0043903 A1    Feb. 13, 2014

(30) Foreign Application Priority Data

Aug. 7, 2012 (KR) .................. 10-2012-0086393

(51) Int. Cl.
| G11C 16/26 | (2006.01) |
| G11C 13/00 | (2006.01) |
| G11C 11/56 | (2006.01) |
| G11C 29/02 | (2006.01) |
| G06F 11/10 | (2006.01) |
| G11C 16/04 | (2006.01) |

(52) U.S. Cl.
CPC ............ *G11C 16/26* (2013.01); *G06F 11/1048* (2013.01); *G11C 11/5642* (2013.01); *G11C 13/004* (2013.01); *G11C 29/021* (2013.01); *G11C 29/028* (2013.01); *G11C 16/0483* (2013.01)

(58) Field of Classification Search
USPC ..................................... 365/185.03
See application file for complete search history.

(56) References Cited

U.S. PATENT DOCUMENTS

| 6,651,212 | B1 | 11/2003 | Katayama et al. |
| 7,996,727 | B2 | 8/2011 | Radke |
| 8,072,805 | B2* | 12/2011 | Chou et al. ............... 365/185.03 |
| 8,125,827 | B2* | 2/2012 | Park ......................... 365/185.09 |
| 8,140,935 | B2* | 3/2012 | Hong et al. .................... 714/755 |
| 2009/0070655 | A1 | 3/2009 | Hsu |

(Continued)

FOREIGN PATENT DOCUMENTS

| JP | 2010092574 | 4/2010 |
| KR | 20090105760 | 10/2009 |

*Primary Examiner* — Alexander Sofocleous
*Assistant Examiner* — Mushfique Siddique
(74) *Attorney, Agent, or Firm* — Volentine & Whitt, PLLC

(57) ABSTRACT

A method of determining a read voltage of a memory device includes performing a plurality of read operations with respective different read voltages on a first group of storage regions of the memory device using a first error correction rate, wherein the plurality of read operations are performed to distinguish between a pair of adjacent logic states of memory cells in the first group of storage regions, detecting a read voltage level, among the different read voltages, at which a minimum number of erroneous bits is generated in the at least one read operation, and determining a read voltage for a second group of storage regions to which a second error correction rate is applied, based on the detected read voltage level, wherein the first error correction rate is higher than the second error correction rate.

17 Claims, 26 Drawing Sheets

(56) References Cited

U.S. PATENT DOCUMENTS

| | | |
|---|---|---|
| 2009/0241008 A1 | 9/2009 | Kim et al. |
| 2011/0231738 A1 | 9/2011 | Horisaki |
| 2011/0239081 A1 | 9/2011 | Hida et al. |
| 2011/0246858 A1 | 10/2011 | Aoyagi |
| 2011/0289380 A1 | 11/2011 | Wilkerson et al. |
| 2012/0017139 A1 | 1/2012 | Otsuka |
| 2012/0033499 A1* | 2/2012 | Kim .................. 365/185.18 |
| 2012/0096333 A1 | 4/2012 | Kang et al. |

* cited by examiner

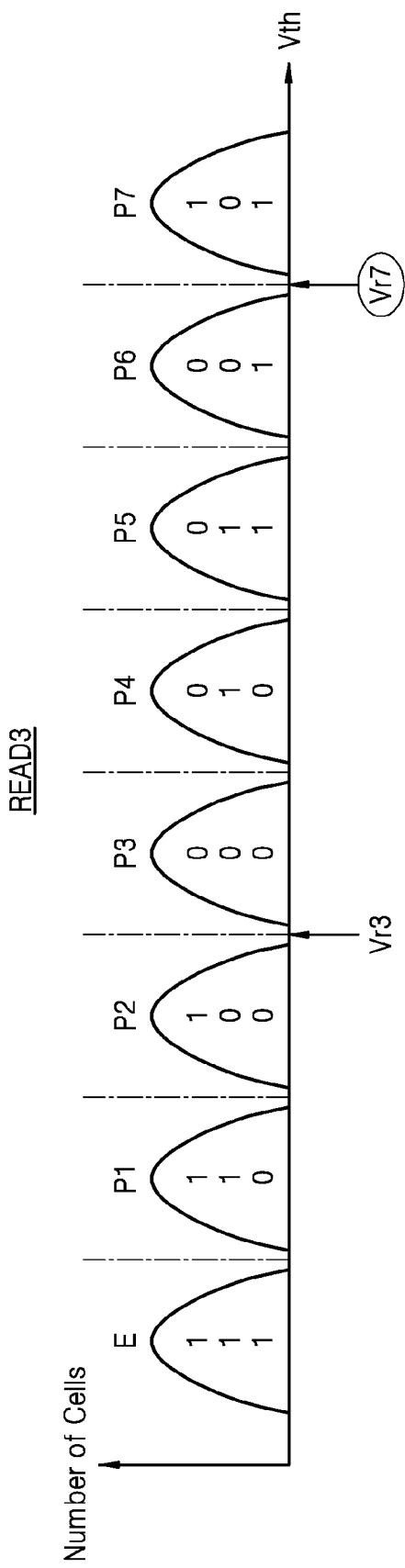

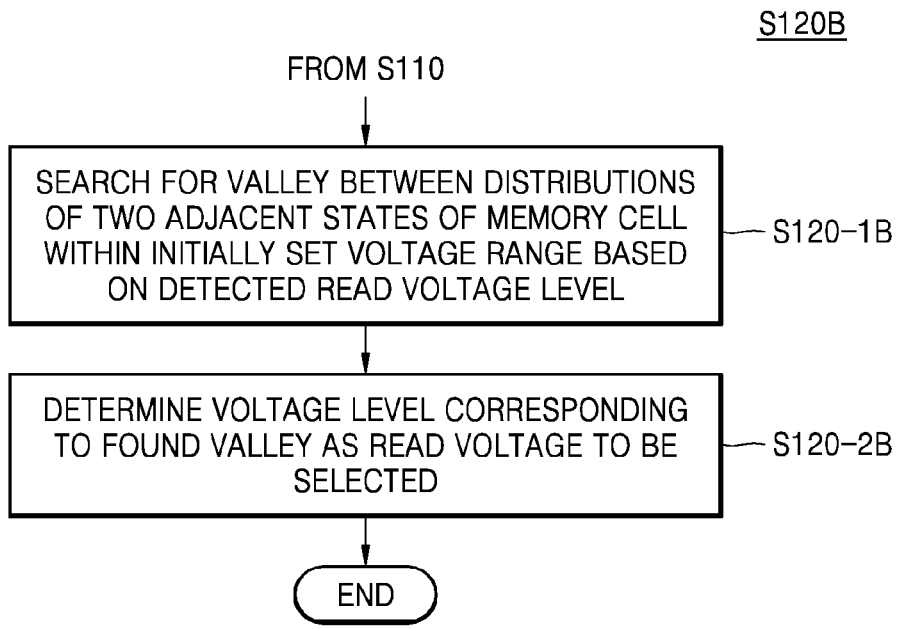
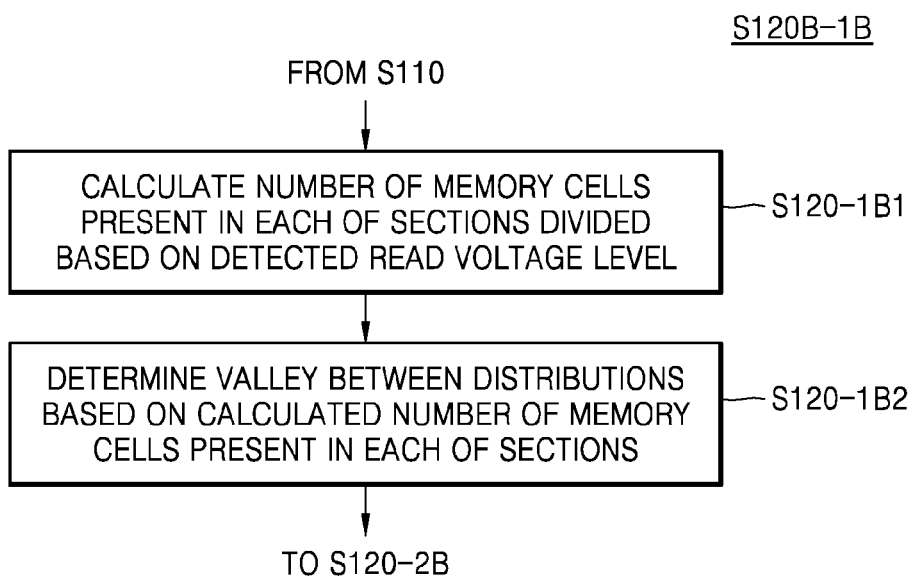

US 9,190,160 B2

MEMORY DEVICE HAVING VARIABLE READ VOLTAGE AND RELATED METHODS OF OPERATION

CROSS-REFERENCE TO RELATED APPLICATIONS

This application claims priority under 35 U.S.C. §119 to Korean Patent Application No. 10-2012-0086393, filed on Aug. 7, 2012, the disclosure of which is hereby incorporated by reference.

BACKGROUND OF THE INVENTION

The inventive concept relates generally to electronic memory technologies. More particularly, certain embodiments of the inventive concept relate to memory devices and related methods of operation.

Certain types of memory devices can be read by applying a predetermined read voltage to one or more memory cells and detecting respective states of the memory cells when receiving the predetermined read voltage. For instance, certain types of nonvolatile memory devices can be read by applying a read voltage to at least one terminal of each memory cell and determining whether each memory cell assumes an "on" state or an "off" state when receiving the predetermined read voltage.

One potential shortcoming of reading a memory device in the above manner is that different memory cells may respond differently to the predetermined read voltage. For instance, some memory cells may require a higher read voltage in order to assume the "on" state due to differing amounts of usage or electrical noise, for instance. This shortcoming can lead to read errors.

Due to the above and other shortcomings of conventional read methods, researchers continue to devote resources to the problem of ensuring that a proper read voltage is applied to memory cells during read operations.

SUMMARY OF THE INVENTION

According to one embodiment of the inventive concept, a method of determining a read voltage of a memory device comprises performing a plurality of read operations with respective different read voltages on a first group of storage regions of the memory device using a first error correction rate, wherein the plurality of read operations are performed to distinguish between a pair of adjacent logic states of memory cells in the first group of storage regions, detecting a read voltage level, among the different read voltages, at which a minimum number of erroneous bits is generated in the at least one read operation, and determining a read voltage for a second group of storage regions to which a second error correction rate is applied, based on the detected read voltage level, wherein the first error correction rate is higher than the second error correction rate.

According to another embodiment of the inventive concept, a method of reading data from a memory device comprises determining whether a failure in correction of errors occurs during a read operation performed on the memory device, detecting a read voltage level at which a minimum number of erroneous bits is generated due to a read operation performed on a first group of storage regions of the memory device to which a first error correction rate is applied where it is determined that the failure in correction of errors occurs, determining a read voltage for a second group of storage regions to which a second error correction rate is applied, based on the detected read voltage level, and performing a read operation on the first and second groups of storage regions of the memory device by applying the determined read voltage for the second group of storage regions, wherein the first error correction rate is higher than the second error correction rate.

According to still another embodiment of the inventive concept, a system comprises a memory device comprising a first group of storage regions and a second group of storage regions, and a memory controller comprising a read voltage controller configured to perform a plurality of read operations with respective different read voltages on the first group of storage regions using a first error correction rate, wherein the plurality of read operations are performed to distinguish between a pair of adjacent logic states of memory cells in the first group of storage regions, and further configured to detect a read voltage level, among the different read voltages, at which a minimum number of erroneous bits is generated in the at least one read operation, and determine a read voltage for a second group of storage regions to which a second error correction rate is applied, based on the detected read voltage level, wherein the first error correction rate is higher than the second error correction rate.

These and other embodiments of the inventive concept can potentially improve the reliability of memory devices by adjusting read voltages to compensate for variations between different memory cells.

BRIEF DESCRIPTION OF THE DRAWINGS

The drawings illustrate selected embodiments of the inventive concept. In the drawings, like reference numbers indicate like features.

FIG. 10C is a graph showing an order for reading pages according to an embodiment of the inventive concept.

FIG. 22 is a flowchart illustrating an operation for determining the read voltage for the storage regions to which the second error correction rate is applied in the method of FIG. 19, according to another embodiment of the inventive concept.

FIG. 23 is a flowchart illustrating operations for searching for a valley between distributions of two adjacent states of a memory cell in the operation of FIG. 22, according to an embodiment of the inventive concept.

DETAILED DESCRIPTION

Selected embodiments of the inventive concept are described below with reference to the accompanying drawings. These embodiments are presented as teaching examples and should not be construed to limit the scope of the inventive concept.

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, features of the embodiments referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art. It will be further understood that terms in common usage should also be interpreted as is customary in the art and not in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Figure 1:
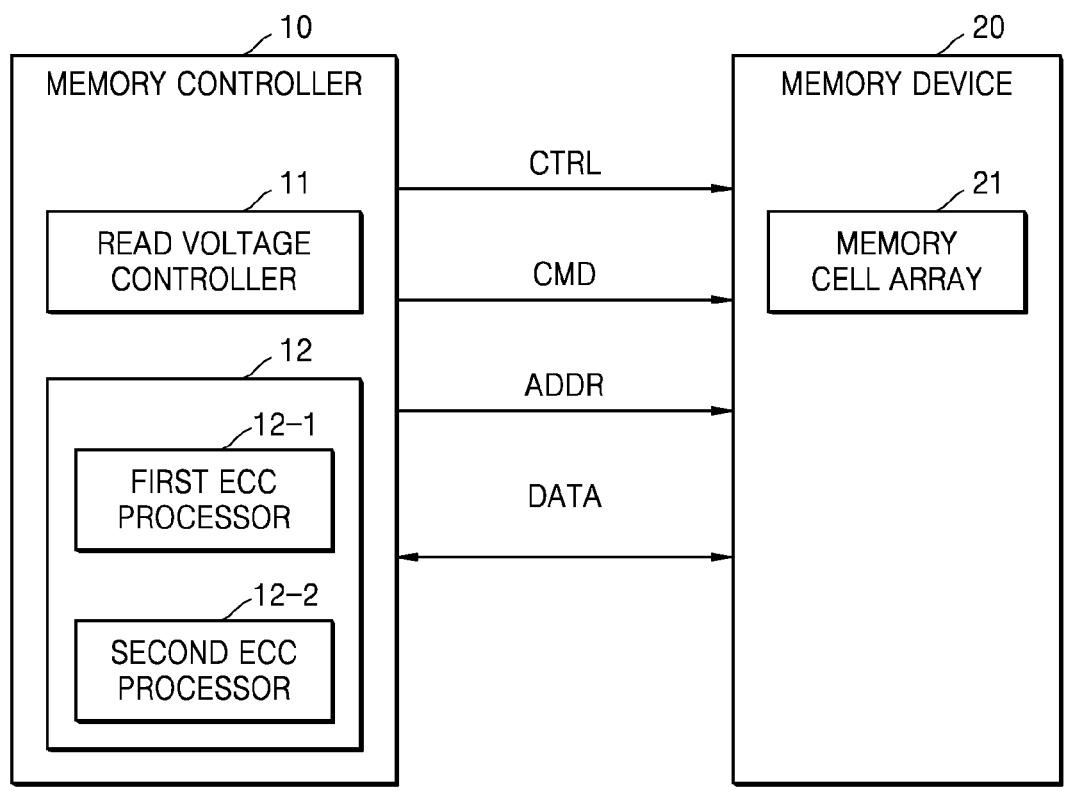
FIG. 1 is a block diagram of a memory system according to an embodiment of the inventive concept.

FIG. 1 is a block diagram of a memory system 100 according to an embodiment of the inventive concept.

Referring to FIG. 1, memory system 100 comprises a memory controller 10 and a memory device 20. Memory controller 10 performs a control operation on memory device 20. Specifically, memory controller 10 provides an address ADDR, a command CMD, and a control signal CTRL to memory device 20 and controls program (or write), read, and erase operations of memory device 20.

Memory device 20 comprises a memory cell array 21, which comprises a plurality of memory cells disposed at intersections between a plurality of word lines and a plurality of bit lines. In some embodiments, the memory cells are flash memory cells, and memory cell array 21 comprises a NAND flash memory cell array or a NOR flash memory cell array. In the description that follows, it will be assumed that the memory cells are flash memory cells, although the inventive concept is not limited thereto, and the memory cells may be resistive memory cells, such as those of resistive random access memories (RRAMs), phase-change RAMs (PRAMs), or magnetic RAMs (MRAMs), in other embodiments.

Memory controller 10 comprises a read voltage controller 11 and an error correction code (ECC) processing block 12. Thus, memory controller 10 may control a voltage level of a read voltage required to read data from the memory cells and output the controlled read voltage to control memory device 20.

ECC processing block 12 comprises a first ECC processor 12-1 and a second ECC processor 12-2. Each of first ECC processor 12-1 and second ECC processor 12-2 performs an ECC encoding operation and an ECC decoding operation using an algorithm, such as Reed-Solomon (RS) codes, Hamming, or cyclic redundancy check (CRC), for instance.

First ECC processor 12-1 performs an ECC encoding operation to generate parity bits and adds the parity bits to data to be programmed to enable correction of errors at a first error correction rate. It also performs an ECC decoding operation to detect erroneous bits from data read from a first group of storage regions to which the first error correction rate of memory device 20 is applied and to correct the detected erroneous bits.

Second ECC processor 12-2 performs an ECC encoding operation to generate parity bits and to add the parity bits to data to be programmed to enable correction of errors at a second error correction rate. It also performs an ECC decoding operation to detect erroneous bits from data read from a second group of storage regions to which the second error correction rate of memory device 20 is applied and to correct the detected erroneous bits.

The first error correction rate can be set higher than the second error correction rate. Also, as an error correction rate increases, the number of parity bits generated per data of the same size may increase. The ECC encoding operation and the ECC decoding operation may be referred to in abbreviated form as an encoding operation and a decoding operation, respectively.

Meta data is stored in the first group of storage regions of memory device 20, whereas user data is stored in the second group of storage regions. First ECC processor 12-1 checks whether an error (i.e., read error) is present in meta data read from the first group of storage regions of memory device 20 and corrects the error when the error is present in the meta data. For example, first ECC processor 12-1 may compare parity bits generated and stored during the programming of the meta data with parity bits generated during the reading of the meta data, detect erroneous bits of the meta data, and perform a logical XOR operation on the detected erroneous bits to correct the read error.

In addition, second ECC processor 12-2 may check whether an error is present in user data read from the second group of storage regions of memory device 20 and correct the error when the error is present in the user data. For example, second ECC processor 12-2 may compare parity bits generated and stored during the programming of the user data with parity bits generated during the reading of the user data, detect erroneous bits of the user data, and perform a logic XOR operation on the detected erroneous bits to correct the read error.

Read voltage controller 11 controls a voltage level of a read voltage required to read memory device 20 (i.e., a voltage level of a read voltage required to read data stored in memory cells disposed in memory cell array 21) based on data DATA received from memory device 20. In this case, an output of read voltage controller 11 may be provided as a control signal CTRL to memory device 20. Because memory controller 10 includes read voltage controller 11, even if a threshold voltage of the memory cells varies due to external stimuli and wearing, memory controller 10 may control the voltage level of the read voltage based on the varying threshold voltage and improve a raw bit error rate (RBER).

In some embodiments, read voltage controller 11 sequentially changes read voltage levels and applies the respective read voltage levels to memory device 20. Thus, read voltage controller 11 may detect a read voltage level at which the minimum number of erroneous bits is detected by first ECC processor 12-1 from data read from the first group of storage regions to which the first error correction rate of memory device 20 is applied. Read voltage controller 11 may determine a read voltage for the second group of storage regions to which the second error correction rate is applied, based on the detected read voltage level. By applying the determined read voltage for the second group of storage regions, a read operation may be performed on the first and second groups of storage regions. That is, the determined read voltage for the second group of storage regions may be set as a read voltage for the first and second group of storage regions.

In some embodiments, read voltage controller 11 sequentially changes read voltage levels, applies the changed read voltage levels to memory device 20, calculates the number of erroneous bits detected by first ECC processor 12-1 at each of the read voltage levels from data read from storage regions to which the error correction rate is applied, and detects a read voltage level at which the calculated number of erroneous bits is minimized, out of a plurality of read voltage levels.

In some embodiments, the first group of storage regions to which the first error correction rate is applied comprises a storage region in which meta data is stored. The number of erroneous bits may be calculated by reading some meta data stored in the first group of storage regions.

Furthermore, where a correction of errors fails during the ECC decoding of data read from the second group of storage regions, the number of erroneous bits detected from meta data read from the first group of storage regions in a page that has failed in correcting errors may be calculated to determine the read voltage for the second group of storage regions.

In some embodiments, read voltage controller 11 executes a process of searching for a valley, or minimum, between distributions of two adjacent states of a memory cell within a voltage range initially set based on the detected read voltage level, and it determines a voltage having a voltage level corresponding to the valley.

Where a memory cell MCEL of memory device 20 is a single-level cell, read voltage controller 11 may detect one read voltage level and select a read voltage based on the detected read voltage level.

Where each of memory cells MCEL constituting memory device 20 is a multi-level cell, read voltage controller 11 may sequentially select a plurality of read voltages used to read data in units of logical pages from a plurality of logic pages constituting one physical page.

In some embodiments, memory controller 10 controls memory system 100 to read data from a first group of storage regions and a second group of storage regions in a page, which fails in correcting errors, load the data in a page buffer 25 (see FIG. 2) of memory device 20, detect a read voltage level at which the minimum number of erroneous bits occurs in data for the first group of storage regions, which is loaded in page buffer 25.

Figure 2:
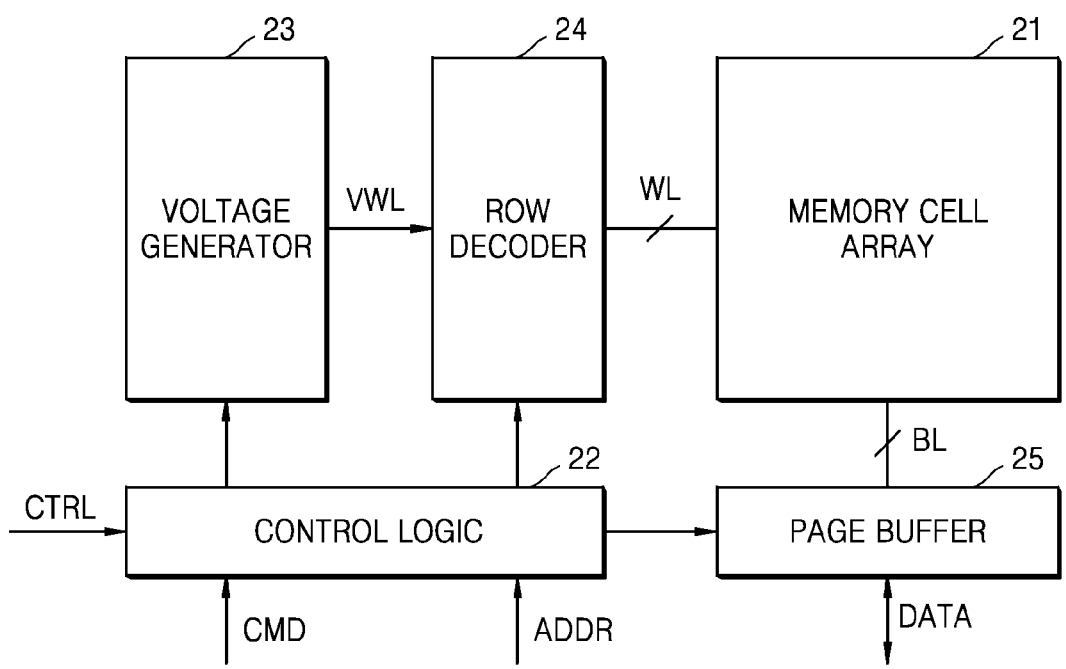
FIG. 2 is a block diagram of a memory device in the memory system of FIG. 1, according to an embodiment of the inventive concept.

FIG. 2 is a block diagram of memory device 20 in memory system 100 of FIG. 1, according to an embodiment of the inventive concept.

Referring to FIG. 2, memory device 20 comprises memory cell array 21, control logic 22, a voltage generator 23, a row decoder 24, and page buffer 25.

Control logic 22 outputs various control signals required to write data in memory cell array 21 or read data from memory cell array 21 based on a command CMD, an address ADDR, and a control signal CTRL received from memory controller 10. The control signals output by control logic 22 are transmitted to voltage generator 23, row decoder 24, and page buffer 25.

Voltage generator 23 generates a driving voltage VWL required to drive a plurality of word lines WL based on the control signals received from control logic 22. Driving voltage VWL may be a write voltage (or program voltage), a read voltage, an erase voltage, or a pass voltage.

Row decoder 24 enables some of word lines WL based on a row address. Specifically, during a read operation, row decoder 24 applies a read voltage to a selected word line and applies a pass voltage to unselected word lines. In some embodiments, a read voltage for the second group of storage regions determined by read voltage controller 11 of memory controller 10 is applied to the selected word line. Thus, where the first group of storage regions and the second group of storage regions are in one page, a read operation is performed on the first group of storage regions and the second group of storage regions using the read voltage for the second group of storage regions. During a write operation, row decoder 24 applies a write voltage to the selected word line and applies a pass voltage to unselected word lines.

Page buffer 25 is connected to memory cell array 21 through a plurality of bit lines BL. Page buffer 25 temporarily stores data to be written in memory cell array 21 or data read from memory cell array 21. Page buffer 25 sequentially applies a plurality of voltage levels and store a multiple units of data read from memory cells disposed in memory cell array 21.

Figure 3:
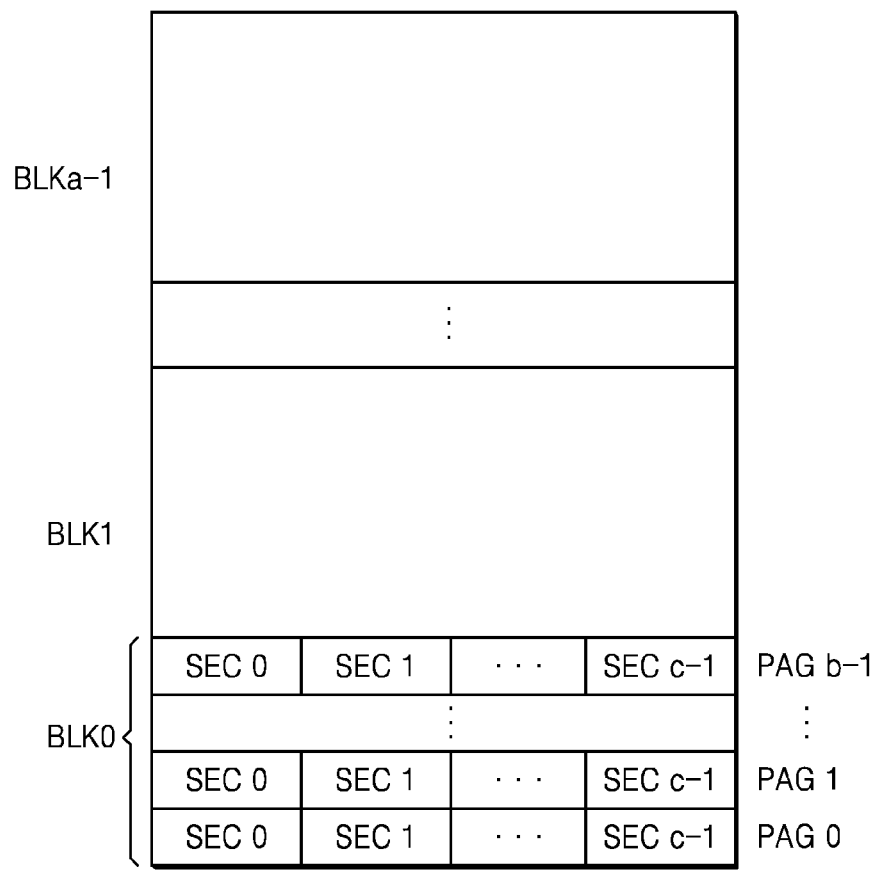
FIG. 3 illustrates an example of a memory cell array in the memory device of FIG. 2.

FIG. 3 illustrates an example of memory cell array 21 in memory device 20 of FIG. 2. In this example, memory cell array 21 is a flash memory cell array.

Referring to FIG. 3, memory cell array 21 comprises "a" (a>1) blocks BLK0 to BLKa-1, each of the blocks BLK0 to BLKa-1 comprises "b" (b>1) pages PAG0 to PAGb-1, and each of the pages PAG0 to PAGb-1 comprises "c" (c>1) sectors SEC0 to SECc-1. Although FIG. 3 illustrates the pages PAG0 to PAGb-1 and the sectors SEC0 to SECc-1 included only in the block BLK0 for brevity, each of the other blocks BLK1 to BLKa-1 may have the same configuration as the block BLK0.

Figure 4:
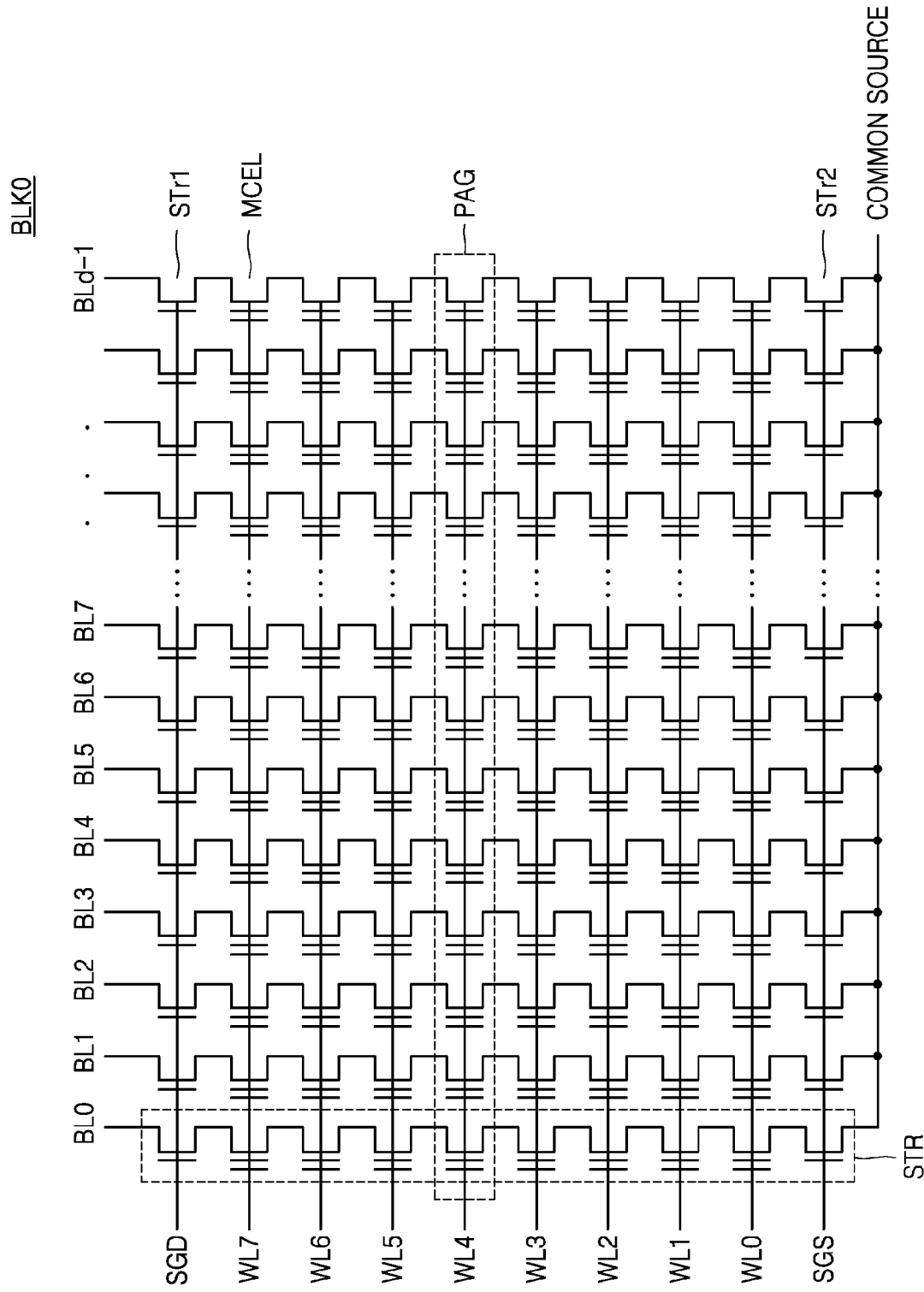
FIG. 4 is a circuit diagram of an example of a memory block of the memory cell array of FIG. 3.

FIG. 4 is a circuit diagram of an example of the memory block BLK0 in memory cell array 21 of FIG. 3. In this example, memory cell array 21 is a memory cell array of a NAND flash memory device.

Referring to FIG. 4, each of the blocks BLK0 to BLKa-1 shown in FIG. 3 may be embodied as shown in FIG. 4. Each of the blocks BLK0 to BLKa-1 comprises "d" (d>1) strings STR, each string STR comprising 8 memory cells MCEL connected in series in the direction of bit lines BL0 to BLd-1. Each of strings STR comprises a drain selection transistor STr1 and a source selection transistor STr2 connected respectively to both ends of the serially connected memory cells MCEL.

The NAND flash memory device having the structure shown in FIG. 4 performs an erase operation in units of blocks and performs a program operation in units of pages PAG corresponding to respective word lines WL0 to WL7. FIG. 4 illustrates an example where 8 pages PAG corresponding to 8 word lines WL0 to WL7 are in one block. However, the blocks BLK0 to BLKa-1 of memory cell array 21 may include a different number of memory cells and pages from the number of memory cells MCEL and pages PAG shown in FIG. 4. Also, memory device 20 of FIGS. 1 and 2 may include a plurality of memory cell arrays that have the same structure as and perform the same operations as memory cell array 21 of FIGS. 3 and 4.

Figure 5:
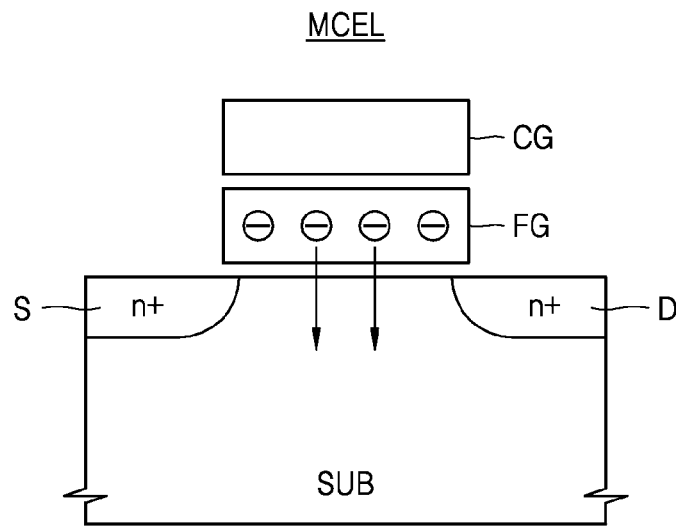
FIG. 5 is a cross-sectional view of an example of a memory cell in the memory block of FIG. 4.

FIG. 5 is a cross-sectional view of an example of a memory cell MCEL in the memory block BLK0 of FIG. 4.

Referring to FIG. 5, a source S and a drain D are formed in a substrate SUB, and a channel region is formed between source S and drain D. A floating gate FG is formed over the channel region, and an insulating layer, such as a tunnelling insulating layer, is disposed between the channel region and floating gate FG. A control gate CG is formed over floating gate FG, and an insulating layer, such as a blocking insulating layer, is disposed between floating gate FG and control gate CG. Voltages required for program, erase, and read operations of memory cell MCEL may be applied to the substrate SUB, source S, drain D, and control gate CG.

In a flash memory device, data stored in memory cell MCEL is read by distinguishing a threshold voltage Vth of memory cell MCEL. The threshold voltage Vth of memory cell MCEL may be determined based on the number of electrons stored in floating gate FG. Specifically, as the electrons stored in floating gate FG increases, the threshold voltage of memory cell MCEL may increase.

The electrons stored in floating gate FG of memory cell MCEL may leak in the direction of arrows shown in FIG. 5 due to various causes. Thus, the threshold voltage of memory cell MCEL may vary. For example, electrons stored in floating gate FG may leak due to wearing of memory cell MCEL. For instance, where memory cell MCEL repeats an access operation, such as a program, erase, or read operation, the insulating layer interposed between the channel region and floating gate FG may be worn away so that electrons stored in floating gate FG may leak. In another example, electrons stored in floating gate FG may leak due to high-temperature stress or a difference in temperature between program and read operations.

Figure 6A:
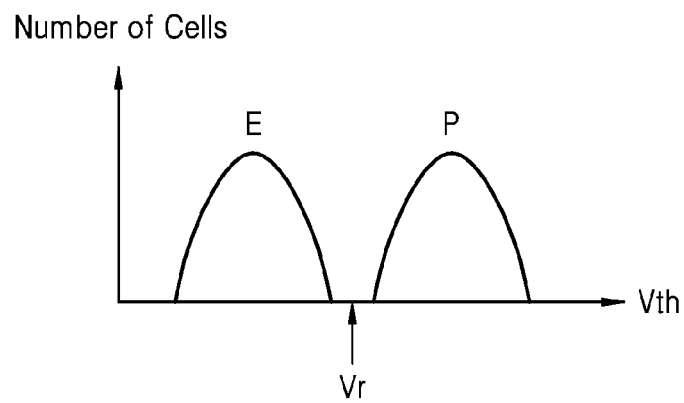
FIG. 6A is a graph showing threshold voltage distributions of a memory device where the memory cell of FIG. 5 is a single-level cell.

FIG. 6A is a graph showing threshold voltage distributions of memory device 20 where memory cell MCEL of FIG. 5 is a single-level cell.

Referring to FIG. 6A, the x-axis denotes a threshold voltage Vth, and the y-axis denotes the number of memory cells MCEL. Where the memory cell is a single-level cell programmed with one bit, each of memory cells MCEL may have one of an erase state E and a program state P. In this case, a read voltage Vr may have a voltage level between the distribution of memory cell MCEL in erase state E and the distribution of memory cell MCEL in program state P.

For example, where a read voltage Vr is applied to control gate CG of memory cell MCEL, memory cell MCEL in an erase state E is turned on, while memory cell MCEL in a program state P is turned off. Where memory cell MCEL is turned on, current flows through memory cell MCEL, and where memory cell MCEL is turned off, substantially no current flows through memory cell MCEL. Thus, data stored in memory cell MCEL may be distinguished depending on whether memory cell MCEL is turned on or off.

In some embodiments, where memory cell MCEL is turned on by applying a read voltage Vr, the stored data may be distinguished as data '1', and where memory cell MCEL is turned off, the stored data may be distinguished as data '0'. However, the inventive concept is not limited thereto. In another embodiment, where memory cell MCEL is turned on by applying read voltage Vr, the stored data may be distinguished as data '0', while memory cell MCEL is turned off, the stored data may be distinguished as data '1'. Thus, allocation of logic levels of data may be changed according to embodiments.

Figure 6B:
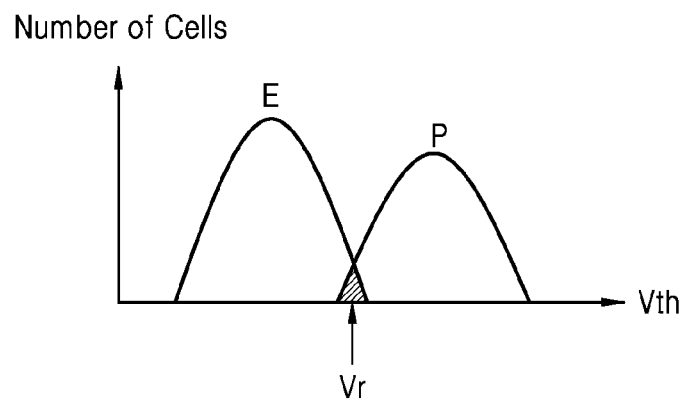
FIG. 6B is a graph showing variation of the threshold voltage distributions illustrated in FIG. 6A.

FIG. 6B is a graph showing variation of the threshold voltage distributions illustrated in FIG. 6A.

Referring to FIG. 6B, each of memory cells MCEL programmed into an erase state E or program state P may have a modified distribution as shown in FIG. 6B due to external stimuli and/or wearing. In FIG. 6B, read errors may occur in memory cells MCEL belonging to a hatched portion, thereby degrading a reliability of memory device 20.

For instance, where a read operation is performed on memory device 20 using a read voltage Vr, even if memory cells MCEL belonging to the hatched portion are programmed into program state P, it may be determined that memory cells MCEL belonging to the hatched portion are in erase state E due to a drop in threshold voltage Vth. Thus, errors may occur in the erase operation, thereby degrading the reliability of memory device 20.

Figure 7A:
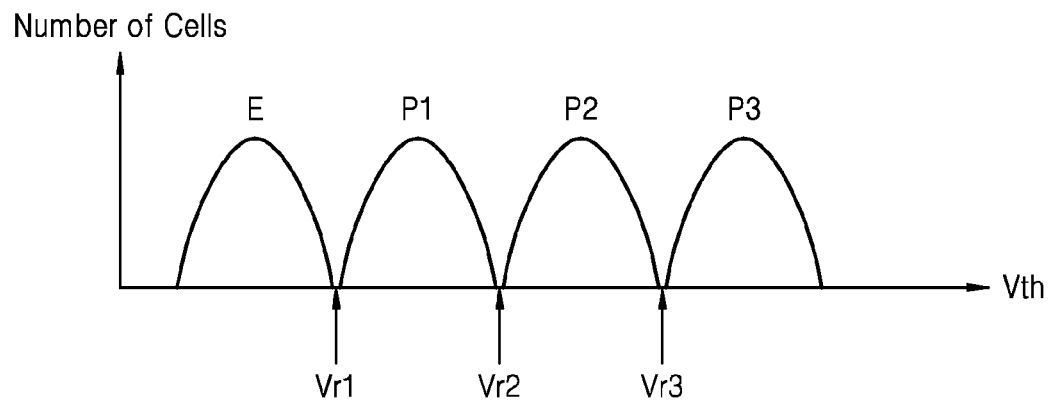
FIG. 7A is a graph showing threshold voltage distributions of the memory device where the memory cell of FIG. 5 is a 2-bit multi-level cell.

FIG. 7A is a graph showing threshold voltage distributions of memory device 20 where memory cell MCEL of FIG. 5 is a 2-bit multi-level cell.

In FIG. 7A, the x-axis denotes a threshold voltage Vth, and the y-axis denotes the number of memory cells. Where each of memory cells MCEL is a 2-bit multi-level cell programmed with 2 bits, each of memory cells MCEL may be in one of an erase state E, a first program state P1, a second program state P2, and a third program state P3. As compared with a single-level cell, in the multi-level cell, because there is a narrow interval between distributions of threshold voltages Vth, critical problems may occur due to a slight variation in threshold voltage Vth.

A first read voltage Vr1 has a voltage level between the distribution of memory cell MCEL in erase state E and the distribution of memory cell MCEL in first program state P1. A second read voltage Vr2 has a voltage level between the distribution of memory cell MCEL in first program state P1 and the distribution of memory cell MCEL in second program state P2. A third read voltage Vr3 has a voltage level between the distribution of memory cell MCEL in second program state P2 and the distribution of memory cell MCEL in third program state P3.

Figure 7B:
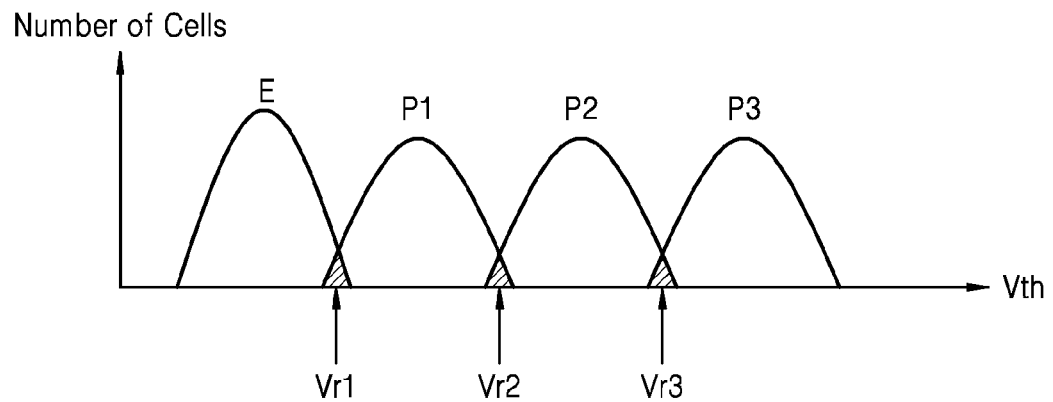
FIG. 7B is a graph showing variation of the threshold voltage distributions illustrated in FIG. 7A.

FIG. 7B is a graph showing variation of the threshold voltage distributions illustrated in FIG. 7A.

Referring to FIG. 7B, memory cells MCEL respectively programmed into erase state E and the first through third program states P1, P2, and P3 may have modified distributions as shown in FIG. 7B due to external stimuli and/or wearing. In FIG. 7B, read errors may occur in memory cells MCEL belonging to a hatched portion, thereby degrading a reliability of memory device 20.

Figure 8A:
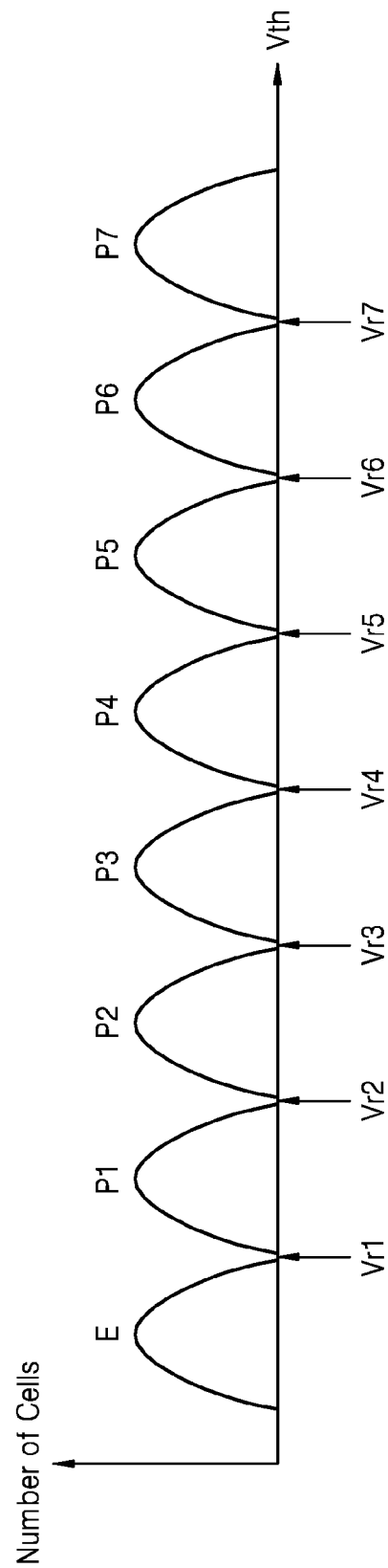
FIG. 8A is a graph showing threshold voltage distributions of the memory device where the memory cell of FIG. 5 is a 3-bit multi-level cell.

FIG. 8A is a graph showing threshold voltage distributions of memory device 20 where memory cell MCEL of FIG. 5 is a 3-bit multi-level cell.

Referring to FIG. 8A, the x-axis denotes a threshold voltage Vth, and the y-axis denotes the number of memory cells MCEL. Where memory cell MCEL is a 3-bit multi-level cell programmed with 3 bits, memory cell MCEL may be in one of an erase state E, a first program state P1, a second program state P2, a third program state P3, a fourth program state P4, a fifth program state P5, a sixth program state P6, and a seventh program state P7. As compared with the single-level cell, in the multi-level cell, because there is a narrow interval between distributions of threshold voltages Vth, errors may occur due to slight variations in threshold voltage Vth.

A first read voltage Vr1 has a voltage level between distribution of memory cell MCEL in erase state E and distribution of memory cell MCEL in first program state P1. A second read voltage Vr2 has a voltage level between distribution of memory cell MCEL in first program state P1 and distribution of memory cell MCEL in second program state P2. A third read voltage Vr3 has a voltage level between distribution of memory cell MCEL in second program state P2 and distribution of memory cell MCEL in third program state P3. A fourth read voltage Vr4 may have a voltage level between distribution of memory cell MCEL in third program state P3 and distribution of memory cell MCEL in fourth program state P4. A fifth read voltage Vr5 has a voltage level between distribution of memory cell MCEL in fourth program state P4 and distribution of memory cell MCEL in fifth program state P5. A sixth read voltage Vr6 may have a voltage level between distribution of memory cell MCEL in fifth program state P5 and distribution of memory cell MCEL in the sixth program state P6. A seventh read voltage Vr7 may have a voltage level between distribution of memory cell MCEL in the sixth program state P6 and distribution of memory cell MCEL in seventh program state P7.

Figure 8B:
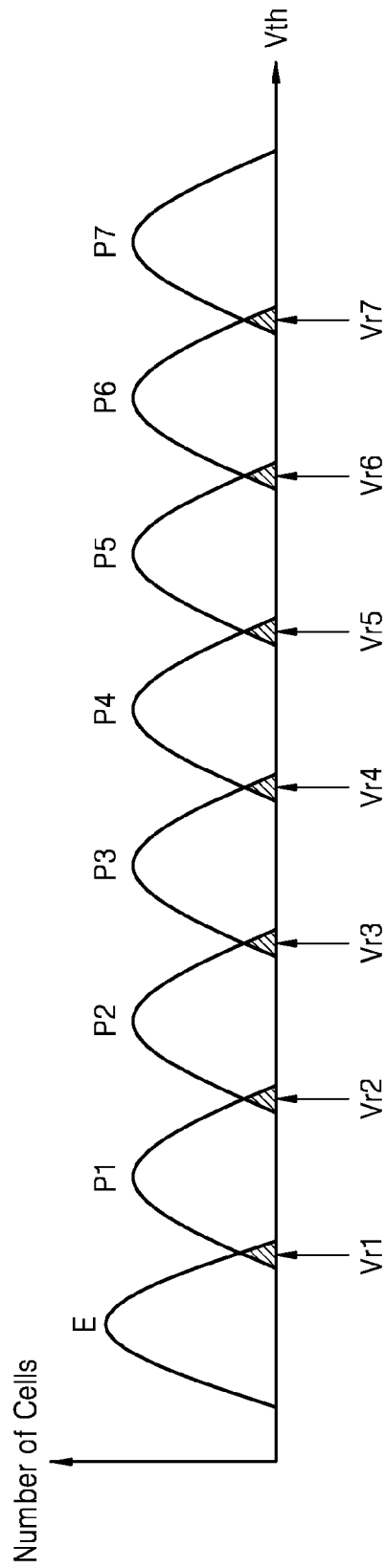
FIG. 8B is a graph showing variation of the threshold voltage distributions illustrated in FIG. 8A.

FIG. 8B is a graph showing variation of the threshold voltage distributions illustrated in FIG. 8A.

Referring to FIG. 8B, memory cells MCEL respectively programmed into erase state E and first through seventh program states P1 to P7 may have modified distributions as shown in FIG. 8B due to external stimuli and/or wearing. In FIG. 8B, read errors may occur in memory cells MCEL belonging to a hatched portion, thereby degrading a reliability of memory device 20.

Where data is read from memory device 20, an error rate may vary according to a voltage level of a read voltage. A selected voltage level of the read voltage may be determined according to a distribution shape of memory cells MCEL. Accordingly, with a variation in the distribution of memory cells MCEL, a selected voltage level of a read voltage required to read data from memory device 20 may also vary. Therefore, it may be necessary to determine the selected voltage level of the read voltage by changing a voltage level of the read voltage based on the variation in the distribution. In this case, it may be necessary to determine the selected voltage level of the read voltage efficiently and rapidly.

Thus far, a case where memory cell MCEL is a single-level cell, a 2-bit multi-level cell, or a 3-bit multi-level cell was described with reference to FIGS. 6A, 6B, 7A, 7B, 8A, and 8B. However, the inventive concept is not limited thereto, and memory cell MCEL of FIG. 5 may be a multi-level cell programmed with 4 bits or more. Also, memory device 20 of FIGS. 1 and 2 may include memory cells MCEL programmed with a different number of bits.

Figure 9:
FIG. 9 illustrates an example of division of a page PAG0 in the memory block of FIG. 4 into storage regions.

FIG. 9 illustrates an example of division of a page PAG0 in the memory block BLK0 of FIG. 4 into storage regions.

Referring to FIG. 9, at least one page comprises regions "Meta" in which meta data is stored, regions "Data" in which user data is stored, regions "Pad" in which pad information is stored, and a region "Mon" in which monitoring information is stored.

The meta data may be information required to manage memory device 20. The meta data serving as management information may include mapping information used to convert a logical address into a physical address of memory device 20. Also, the meta data may include information used to determine a degree of degradation of each region of memory device 20. In some embodiments, information used to determine the degree of degradation of each region of memory device 20 comprises error bit information regarding an ECC algorithm, program/erase cycle information, or information regarding the number of program/erase operations. Also, the meta data may include information required to manage storage of memory device 20.

In the example of FIG. 9, regions Data in which user data is stored may be divided in units of sector sizes. Where data to be programmed does not coincide with the sector size, dummy data is written in a portion remaining after writing data in the sector size in the regions Pad in which pad information is stored. Monitoring information required to find out distribution shift characteristics of memory cells MCEL may be stored in the region Mon in which monitoring information is stored. In some embodiments, region Mon in which monitoring information is stored may be used as a region in which user data is stored or a region in which a different kind of data is stored.

Figure 10A:
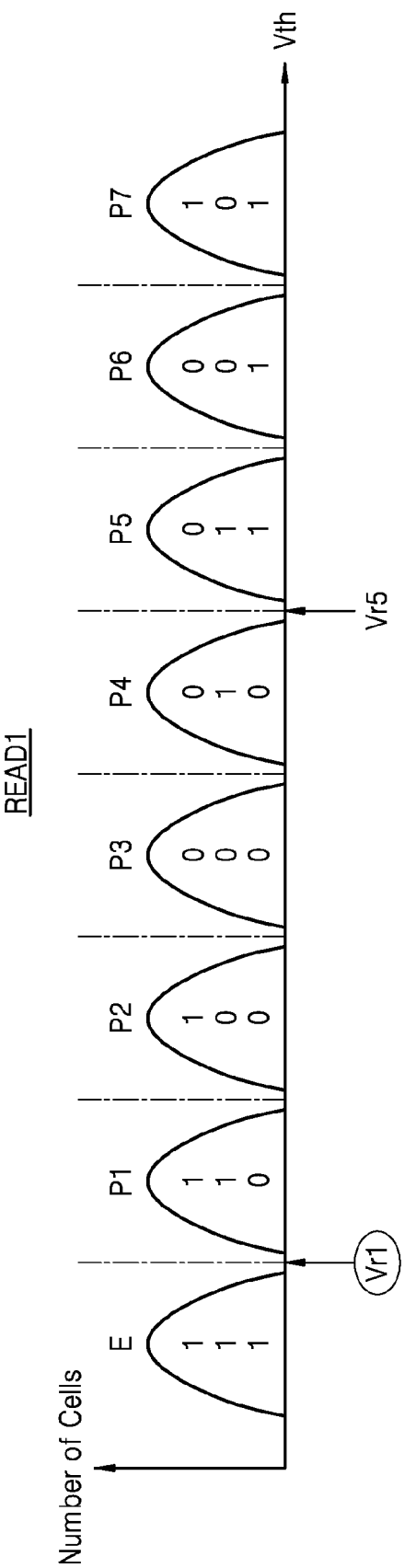
FIG. 10A is a graph showing an order for reading pages according to an embodiment of the inventive concept.
Figure 10B:
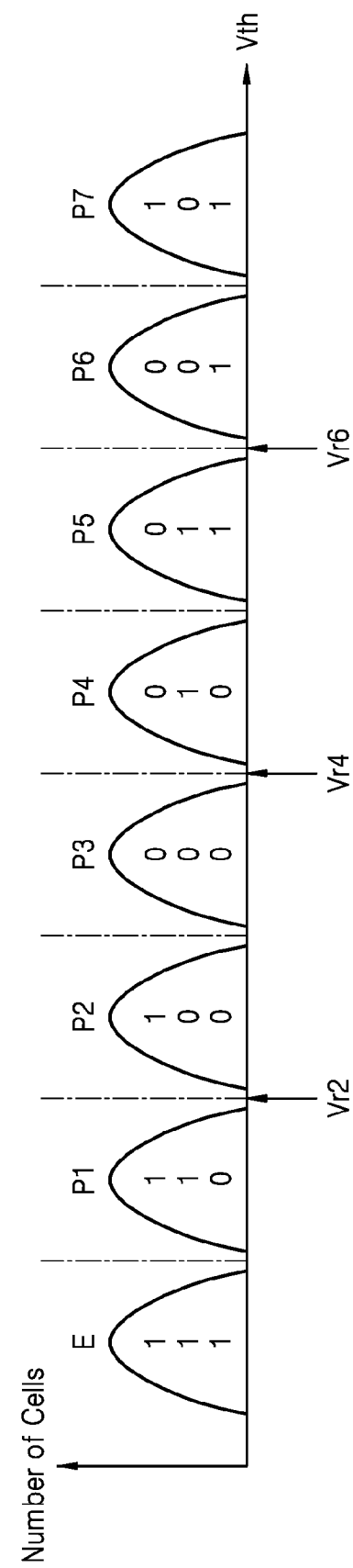
FIG. 10B is a graph showing an order for reading pages according to an embodiment of the inventive concept.

FIGS. 10A through 10C are graphs showing orders of reading pages according to embodiments of the inventive concept.

Referring to FIGS. 10A through 10C, data '111' is assigned to an erase state E, data '110' is assigned to a first program state P1, data '100' is assigned to a second program state P2, data '000' is assigned to a third program state P3, data '010' is assigned to a fourth program state P4, data '011' is assigned to a fifth program state P5, data '001' is assigned to a sixth program state P6, and data '101' is assigned to a seventh program state P7.

Where a memory cell MCEL is a 3-bit multi-level cell programmed with 3 bits, three logical pages may be stored in one physical page. Here, a logical page refers to a set of data that may be simultaneously programmed in one physical page. Accordingly, read operations may be performed three times successively on one physical page including memory cell MCEL. In this example, the order of the read operations performed three times may be changed based on data allocated to an erase state and program states.

In the illustrated embodiment, a first read operation READ1, which is a least significant bit (LSB) read operation, is performed between erase state E in which an LSB is changed and first program state P1 and between fourth program state P4 and fifth program state P5, as shown in FIG. 10A. Thus, reading is performed twice during the first read operation READ1.

A second read operation READ2, which is a central significant bit (CSB) read operation, is performed between first program state P1 in which a CSB is changed and second program state P2, between third program state P3 and fourth program state P4, and between fifth program state P5 and the sixth program state P6, as shown in FIG. 10B. Thus, reading may be performed three times during the second read operation READ2.

A third read operation READ3, which is a most significant bit (MSB) read operation, may be performed between second program state P2 in which an MSB is changed and third program state P3 and between the sixth program state P6 and seventh program state P7, as shown in FIG. 10C. Thus, reading may be performed twice during the third read operation READ3.

In some embodiments, where memory cell MCEL is a 3-bit multi-level cell programmed with 3 bits, read voltage controller 11 of FIG. 1 may perform each of the LSB read operation READ1, the CSB read operation READ2, and the MSB read operation READ3 and optimize the read voltages Vr1 to Vr7.

In some embodiments, read voltage controller 11 selects (or adjusts) first read voltage Vr1 and fifth read voltage Vr5 during the LSB read operation READ1, selects second read voltage Vr2, fourth read voltage Vr4, and sixth read voltage Vr6 during the CSB read operation READ2, and selects the third read voltage Vr3 and the seventh read voltage Vr7 during the MSB read operation READ3.

Figure 11:
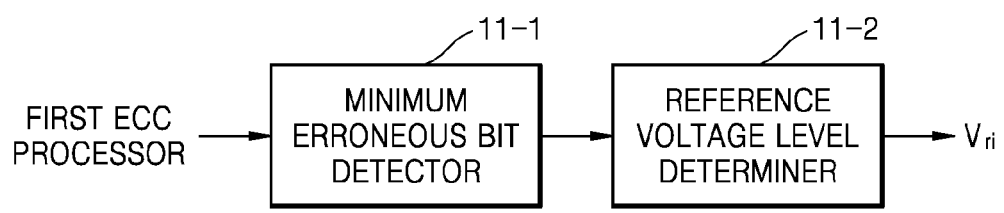
FIG. 11 is a diagram of a read voltage controller in the memory system of FIG. 1, according to an embodiment of the inventive concept.

FIG. 11 is a diagram of read voltage controller 11 in the memory system of FIG. 1, according to an embodiment of the inventive concept.

Referring to FIG. 11, a read voltage controller 11A comprises a minimum erroneous bit detector 11-1 and a reference voltage level determiner 11-2. Where each of memory cells MCEL of memory device 20 is a single-level cell, read voltage controller 11 controls a read voltage level such that levels of a read voltage Vri are sequentially changed and applied to memory device 20.

Thus, memory controller 10 controls the read voltage level and read data from the first group of storage regions of memory device 20, and first ECC processor 12-1 performs error detection/correction operations on the data read from the first group of storage regions of memory device 20.

In some embodiments, where a correction of errors fails during the reading of data from memory device 20, first ECC processor 12-1 of memory controller 10 performs error detection/correction operations on data read from the first group of storage regions to which the first error correction rate is applied, which is in a page that has failed in correcting errors.

In some embodiments, where a correction of errors fails during the reading of data from memory device 20, first ECC processor 12-1 of memory controller 10 performs error detection/correction operations on data read from the first group of storage regions to which the first error correction rate is applied in another page of a block including a page that has failed in correcting errors.

Minimum erroneous bit detector 11-1 sequentially changes a level of a read voltage Vr, applies respective read voltage levels, counts the number of erroneous bits detected during an error detection operation performed by first ECC processor 12-1 on data read from the first group of storage regions of memory device 20, and detects a minimum number of erroneous bits.

Reference voltage level determiner 11-2 detects a level of a read voltage Vr applied to memory device 20 where data from which the minimum number of erroneous bits is detected is read, and it determines the detected level of read voltage Vr as a reference voltage level. In some embodiments, the determined reference voltage level is determined as a read voltage Vri of a single-level cell.

In certain other examples, where memory cell MCEL of memory device 20 is a multi-level cell, read voltage controller 11A controls read voltage levels such that a plurality of read voltages required to read data from a plurality of logical pages constituting one physical page in units of logical pages are sequentially changed in a predetermined order and applied to memory device 20.

In some embodiments, where memory cell MCEL is a 3-bit multi-level cell programmed with 3 bits, read voltage controller 11A performs each of LSB read operation READ1, CSB read operation READ2, and MSB read operation READ3 as shown in FIGS. 10A through 10C.

In the LSB read operation READ1, initially, fifth read voltage Vr5 fixed during the LSB read operation READ1, a read voltage level is controlled to sequentially change a level of first read voltage Vr1 and the changed level of first read voltage Vr1 is applied to memory device 20. In some embodiments, the fifth read voltage Vr5 is fixed at an initial level of the fifth read voltage Vr5.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies first read voltage Vr1 having the changed level and the fixed fifth read voltage Vr5, count the number of erroneous bits detected during the error detection operation performed by first ECC processor 12-1 on the data read from the first group of storage regions of memory device 20, and detect a minimum number of erroneous bits.

Reference voltage level determiner 11-2 detects a level of first read voltage Vr1 applied to memory device 20 where data from which the minimum number of erroneous bits is detected is read, and it determines the detected level of first read voltage Vr1 as a first reference voltage level. In some embodiments, the determined first reference voltage level is determined as a first read voltage Vr1 of a multi-level cell.

Next, with first read voltage Vr1 fixed during the LSB read operation READ1, a read voltage level is controlled to sequentially change a level of the fifth read voltage Vr5 and apply the changed level of fifth read voltage Vr5. In some embodiments, first read voltage Vr1 is fixed at the first reference voltage level.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies the changed level of fifth read voltage Vr5 and the fixed first read voltage Vr1, counts the number of erroneous bits detected during the error detection operation performed by first ECC processor 12-1 on data read from the first group of storage regions of memory device 20, and detects the minimum number of erroneous bits.

Reference voltage level determiner 11-2 detects a level of a fifth read voltage Vr5 applied to memory device 20 where data from which a minimum number of erroneous bits is detected is read, and it selects the detected fifth read voltage Vr5 as a fifth reference voltage level. In some embodiments, the determined fifth reference voltage level is determined as a fifth read voltage Vr5 of the multi-level cell.

Due to the above-described operation, the first and fifth reference voltage levels corresponding to first and fifth read voltages Vr1 and Vr5 applied to memory device 20 during the LSB read operation READ1 may be determined. Also, first and fifth read voltages Vr1 and Vr5 applied to memory device 20 during the LSB read operation READ1 are determined as the first and fifth reference voltage levels, respectively.

In CSB read operation READ2, initially, with each of fourth read voltage Vr4 and sixth read voltage Vr6 fixed, the read voltage level is controlled to sequentially change a level of second read voltage Vr2 and second read voltage Vr2 having the changed level is applied to memory device 20. In some embodiments, fourth and sixth read voltages Vr4 and Vr6 are fixed at initial levels of the fourth and sixth read voltages Vr4 and Vr6, respectively.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies second read voltage Vr2 having the changed level and the fixed fourth and sixth read voltages Vr4 and Vr6, counts the number of erroneous bits detected during the error detection operation performed by first ECC processor 12-1 on the data read from the first group of storage regions of memory device 20, and detects the minimum number of erroneous bits.

Reference voltage level determiner 11-2 detects a level of a second read voltage Vr2 applied to memory device 20 where data from which a minimum number of erroneous bits is detected is read, and determine the detected level of the second read voltage Vr2 as a second reference voltage level. In some embodiments, the determined second reference voltage level is determined as a second read voltage Vr2 of the multi-level cell.

Next, with each of second and sixth read voltages Vr2 and Vr6 fixed during the CSB read operation READ2, the read voltage level is controlled to sequentially change a level of fourth read voltage Vr4 and apply fourth read voltage Vr4 having the changed level to memory device 20. In some embodiments, second read voltage Vr2 is fixed at the second reference voltage level. Also, the sixth read voltage Vr6 is fixed at an initial level of the sixth read voltage Vr6.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies fourth read voltage Vr4 having the changed level and the fixed second and sixth read voltages Vr2 and Vr6, counts the number of erroneous bits detected during the error detection operation performed by first ECC processor 12-1 on the data read from the first group of storage regions of memory device 20, and detects the minimum number of erroneous bits.

Reference voltage level determiner 11-2 detects a level of a fourth read voltage Vr4 applied to memory device 20 where data from which a minimum number of erroneous bits is detected is read, and it determines the detected level of fourth read voltage Vr4 as a fourth reference voltage level. In some embodiments, the determined fourth reference voltage level is determined as a fourth read voltage Vr4 of the multi-level cell.

Next, with each of the second and fourth read voltages Vr2 and Vr4 fixed during the CSB read operation READ2, the read voltage level is controlled to sequentially change a level of sixth read voltage Vr6 and apply sixth read voltage Vr6 having the changed level to memory device 20. In some embodiments, the second and fourth read voltages Vr2 and Vr4 are fixed at second and fourth reference voltage levels, respectively.

Memory controller 10 may controls the read voltage level and read data from the first group of storage regions of memory device 20, and first ECC processor 12-1 performs error detection/correction operations on the data read from the first group of storage regions of memory device 20.

Minimum erroneous bit detector 11-1 applies sixth read voltage Vr6 having the changed level and the fixed second and fourth read voltages Vr2 and Vr4, counts the number of erroneous bits detected during the error detection operation performed by first ECC processor 12-1 on the data read from the first group of storage regions of memory device 20, and detects the minimum number of erroneous bits.

Reference voltage level determiner 11-2 detects a level of a sixth read voltage Vr6 applied to memory device 20 where data from which a minimum number of erroneous bits is detected is read, and it determines the detected level of sixth read voltage Vr6 as a sixth reference voltage level. In some embodiments, the determined sixth reference voltage level is determined as a sixth read voltage Vr6 of the multi-level cell.

Due to the above-described operations, second, fourth, and sixth reference voltage levels corresponding to second, fourth, and sixth read voltages Vr2, Vr4, and Vr6 applied to memory device 20 during the CSB read operation READ2 may be determined. Also, second, fourth, and sixth read voltages Vr2, Vr4, and Vr6 applied to memory device 20 during the CSB read operation READ2 may be determined as the second, fourth, and sixth reference voltage levels, respectively.

In the MSB read operation READ3, initially, with seventh read voltage Vr7 fixed, the read voltage level is controlled to sequentially change a level of the third read voltage Vr3 and third read voltage Vr3 having the changed level is applied to memory device 20. In some embodiments, the seventh read voltage Vr7 is fixed at an initial level of seventh read voltage Vr7.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies third read voltage Vr3 having the changed level and fixed seventh read voltage Vr7, counts the number of erroneous bits detected during the error detection operation performed by first ECC processor 12-1 on the data read from the first group of storage regions of memory device 20, and detects the minimum number of erroneous bits.

Reference voltage level determiner 11-2 detects a level of the third read voltage Vr3 applied to memory device 20 where data from which a minimum number of erroneous bits is detected is read, and determines the detected level of the third read voltage Vr3 as a third reference voltage level. In some embodiments, the determined third reference voltage level is determined as a third read voltage Vr3 of the multi-level cell.

Next, with third read voltage Vr3 fixed during the MSB read operation READ3, the read voltage level is controlled to sequentially change a level of the seventh read voltage Vr7 and apply the seventh read voltage Vr7 having the changed level to memory device 20. In some embodiments, third read voltage Vr3 is fixed at the third reference voltage level.

Memory controller 10 controls the read voltage level and read data from the first group of storage regions of memory device 20, and first ECC processor 12-1 performs error detection/correction operations on the data read from the first group of storage regions of memory device 20.

Minimum erroneous bit detector 11-1 applies seventh read voltage Vr7 having the changed level and the fixed third read voltage Vr3, counts the number of erroneous bits detected during the error detection operation performed by first ECC processor 12-1 on the data read from the first group of storage regions of memory device 20, and detects the minimum number of erroneous bits.

Reference voltage level determiner 11-2 detects a level of the seventh read voltage Vr7 applied to memory device 20 when data from which a minimum number of erroneous bits is detected is read, and it determines the detected level of the seventh read voltage Vr7 as a seventh reference voltage level. In some embodiments, the determined seventh reference voltage level is determined as a seventh read voltage Vr7 of the multi-level cell.

The above-described operation can determine the third reference voltage level and the seventh reference voltage level corresponding respectively to the third read voltage Vr3 and the seventh read voltage Vr7 applied to memory device 20 during the MSB read operation READ3. Also, the third read voltage Vr3 and the seventh read voltage Vr7 applied to memory device 20 during the MSB read operation READ3 may be determined as the third reference voltage level and the seventh reference voltage level, respectively. Moreover, due to the above-described operations, reference voltage level determiner 11-2 may determine each of a plurality of read voltages Vri of the multi-level cell.

In the operation of optimizing a read voltage during LSB read operation READ1, CSB read operation READ2, and MSB read operation READ3, the order of the fixed read voltages and the changed read voltages may be varied. While the operation of selecting the read voltage in an example where memory cell MCEL is the single-level cell or 3-bit multi-level cell is described above, the inventive concept is not limited thereto, and a read voltage may be selected in the same manner as described above in a 2-bit multi-level cell or a multi-level cell programmed with 4 bits or more.

Figure 12:
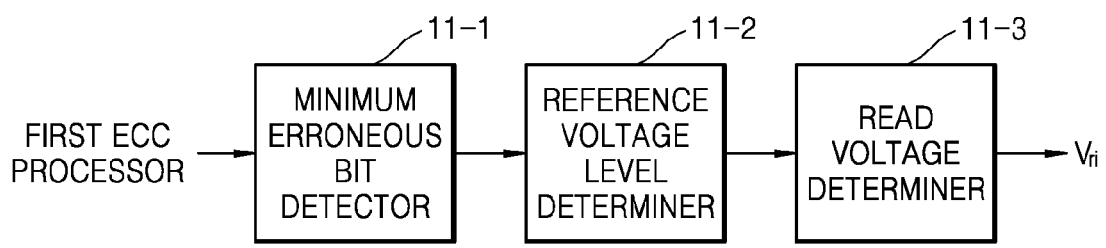
FIG. 12 is a diagram of a read voltage controller in the memory system of FIG. 1, according to another embodiment of the inventive concept.

FIG. 12 is a diagram of a read voltage controller in the memory system of FIG. 1, according to another embodiment of the inventive concept.

Referring to FIG. 12, a read voltage controller 11A' comprises a minimum erroneous bit detector 11-1, a reference voltage level determiner 11-2, and a read voltage determiner 11-3. Among the features of read voltage controller 11A' shown in FIG. 12, minimum erroneous bit detector 11-1 and reference voltage level determiner 11-2 are substantially the same as elements in read voltage controller 11A of FIG. 11. Read voltage determiner 11-3 determines a read voltage Vri for a second group of storage regions to which a second error correction rate of a memory device is applied, based on the reference voltage level determined by reference voltage level determiner 11-2.

In some embodiments, data is read using a reference voltage level as a read voltage from a storage region of memory device 20 to which the second error correction rate is applied, an ECC decoding operation is performed on the read data, and the reference voltage level is determined as the read voltage where a correction of errors is successful. In memory device 20 including multi-level cells, reference voltages for a plurality of read voltages required to read data in units of logical pages from a plurality of logical pages constituting one physical page are applied so that respective read voltages can be determined.

In some embodiments, read voltage determiner 11-3 searches for a valley between distributions of two adjacent states of a memory cell within an initially set voltage range based on a reference voltage level, and it determines a voltage level corresponding to the found valley as a read voltage Vri. This can be accomplished, for instance by calculating the number of memory cells present in each of sections divided by two adjacent voltage levels within the initially set voltage range based on the reference voltage level, and determining a point at which a decreasing number of memory cells present in each of the sections starts to increase as the valley.

Figure 13:
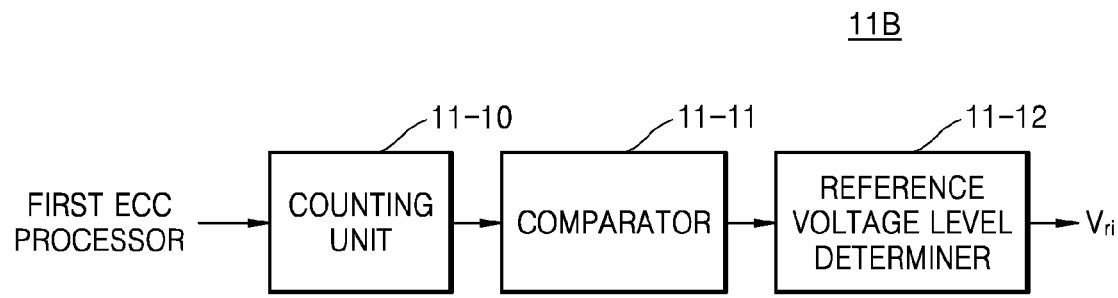
FIG. 13 is a diagram of a read voltage controller in the memory system of FIG. 1, according to another embodiment of the inventive concept.

FIG. 13 is a diagram of read voltage controller 11 in memory system 100 of FIG. 1, according to another embodiment of the inventive concept.

Referring to FIG. 13, a read voltage controller 11B comprises a counting unit 11-10, a comparator 11-11, and a reference voltage level determiner 11-12. Each time a read voltage level is changed to determine a selected read voltage, counting unit 11-10 counts the number of erroneous bits detected during the error detection operation performed by first ECC processor 12-1 at each read voltage levels.

In some embodiments, while sequentially changing a read voltage in a read voltage selection mode, counting unit 11-10 counts the number of erroneous bits detected during the error detection operation performed by first ECC processor 12-1 on data read from the first group of storage regions of memory device 20 at each of the read voltage levels, and it calculates the number of erroneous bits. The read voltage selection mode may be performed under conditions in which the correction of errors fails during the decoding of the data read from the second group of storage regions of memory device 20. Also, a counting period may be determined as a period in which part of meta data stored in the first group of storage regions of memory device 20 is read and first ECC processor 12-1 performs error detection/correction operations on the read data.

Comparator 11-11 compares the number of erroneous bits counted at respective read voltage levels. In some embodiments, comparator 11-11 compares the number of erroneous bits counted at a current read voltage level with the number of erroneous bits counted at a previous read voltage level and outputs information regarding the comparison result to reference voltage level determiner 11-12. In some embodiments, comparator 11-11 outputs a first signal when the number of erroneous bits counted at the current read voltage level is smaller than or equal to the number of erroneous bits counted at the previous read voltage level. Also, comparator 11-11 outputs a second signal when the number of erroneous bits counted at the current read voltage level is greater than the number of erroneous bits counted at the previous read voltage level. Also, counting unit 11-10 outputs a third signal where the current read voltage level is an initial read voltage level.

Where the second signal is applied from comparator 11-11 to reference voltage level determiner 11-12, reference voltage level determiner 11-12 determines a read voltage level applied just prior to the current read voltage level as a reference voltage level at which a minimum number of erroneous bits is generated.

Figure 15:
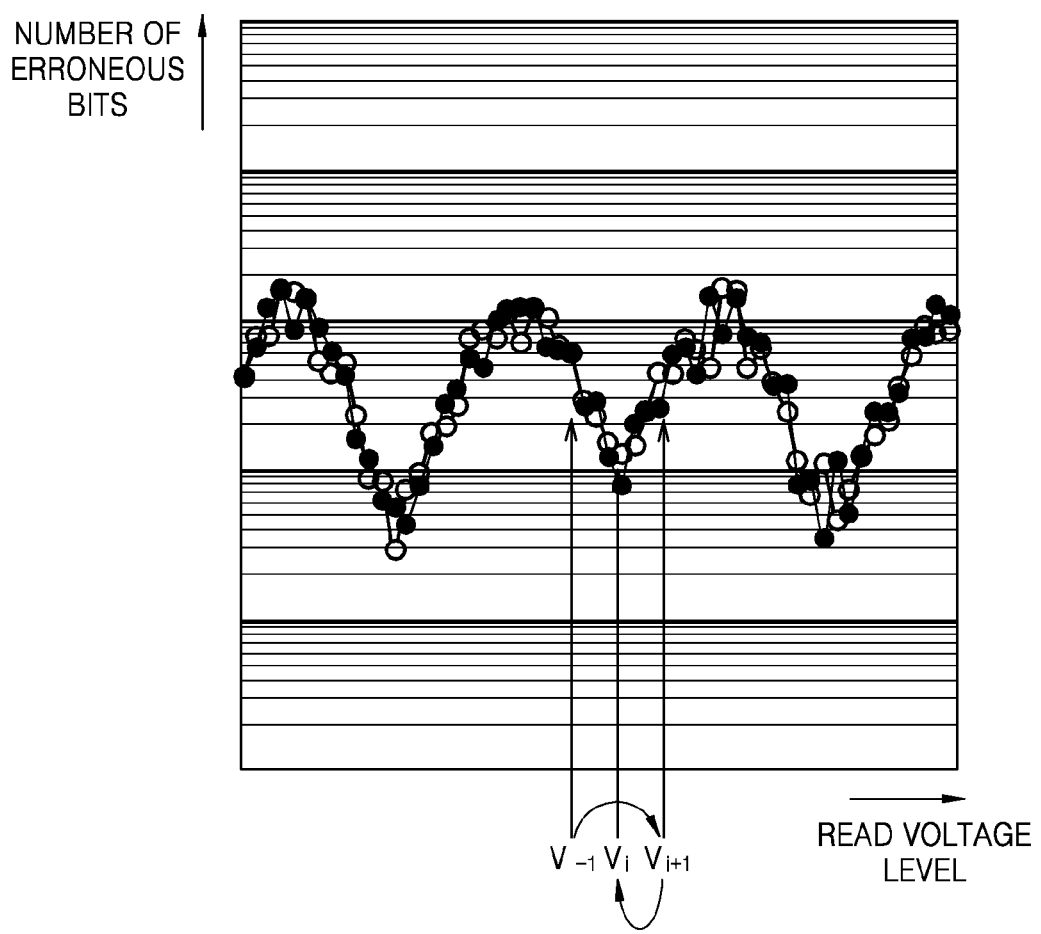
FIG. 15 is a graph showing the generated number of erroneous bits relative to a read voltage level in the memory system of FIG. 1.

In some embodiments, where the number of erroneous bits in data read from the first group of storage regions of memory device 20 is counted at each read voltage level while changing the read voltage level to $V_{i-1}, V_i, V_{i+1}, \ldots$, it is assumed that, as shown in FIG. 15, the number of erroneous bits counted at the read voltage level is 8, the number of erroneous bits counted at the read voltage level $V_i$ is 4, and the number of erroneous bits counted at the read voltage level $V_{i+1}$ is 7. Under these circumstances, comparator 11-11 generates the third signal at the read voltage level generates the first signal at read voltage level and generates the second signal at read voltage level $V_{i+1}$. Thus, reference voltage level determiner 11-12 detects read voltage level Vi applied just prior to the current read voltage level Vi+1 at which the second signal is generated, as a level of a read voltage Vri at which the minimum number of erroneous bits is generated, and determine the detected read voltage level as a reference voltage level.

Figure 14:
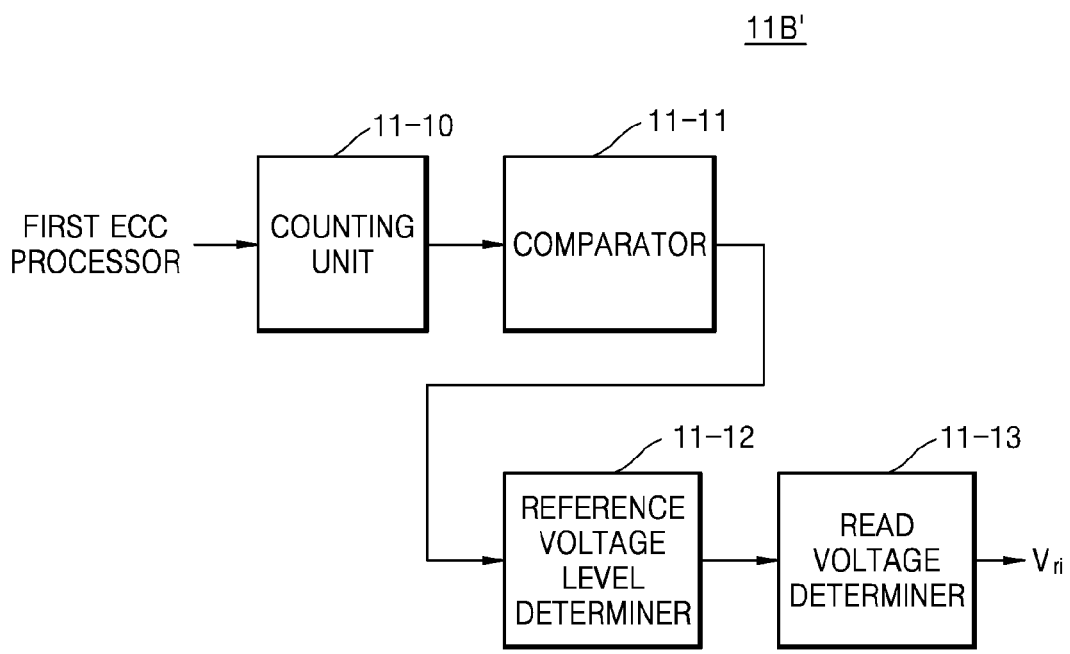
FIG. 14 is a diagram of a read voltage controller in the memory system of FIG. 1, according to another embodiment of the inventive concept.

FIG. 14 is a diagram of read voltage controller 11 in memory system 100 of FIG. 1.

Referring to FIG. 14, a read voltage controller 11B' comprises a counting unit 11-10, a comparator 11-11, a reference voltage level determiner 11-12, and a read voltage determiner 11-3. Among features of read voltage controller 11B' shown in FIG. 14, counting unit 11-10, comparator 11-11, and reference voltage level determiner 11-2 are substantially the same as elements in read voltage controller 11B of FIG. 13. Also, read voltage determiner 11-3 of FIG. 14 is substantially the same as read voltage determiner 11-3 in read voltage controller 11A' of FIG. 12.

Figure 16:
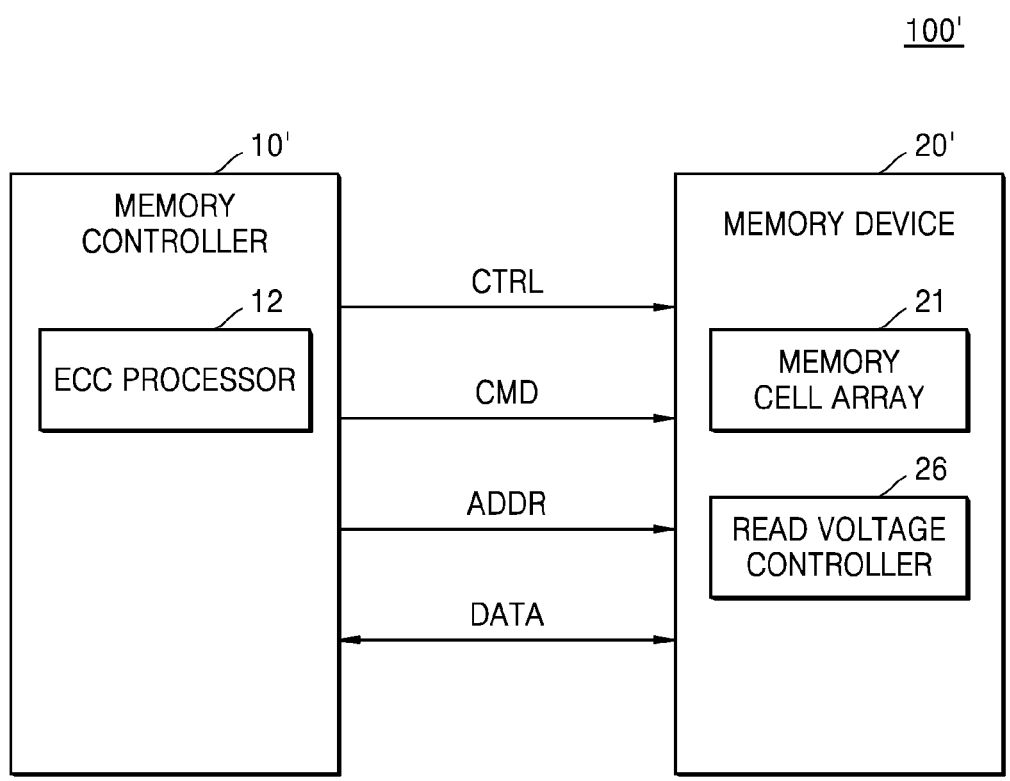
FIG. 16 is a block diagram of a memory system according to another embodiment of the inventive concept.

FIG. 16 is a block diagram of a memory system 100' according to another embodiment of the inventive concept.

Referring to FIG. 16, memory system 100' comprises a memory controller 10' and a memory device 20'. Some features of memory system 100' are substantially the same as features of memory system 100 of FIG. 1. The following description will emphasize only differences between memory system 100 of FIG. 1 and memory system 100' will be described in detail.

Memory device 20' comprises a memory cell array 21 and a read voltage controller 26. Memory cell array 21 comprises a plurality of memory cells disposed at intersections between a plurality of word lines and a plurality of bit lines. Read voltage controller 26 controls a voltage level of a read voltage required to read data stored in the memory cells in memory cell array 21. Read voltage controller 26 substantially corresponds to read voltage controller 11 in memory controller 10 shown in FIG. 1.

Memory controller 10' comprises an ECC processing block 12, which checks whether an error (i.e., read error) is present in data read from memory device 20' and corrects the error where the error is present in the data. ECC processing block 12 comprises a first ECC processor 12-1 and a second ECC processor 12-2. Because ECC processing block 12 is described above with reference to FIG. 1, a repeated description thereof is omitted here.

Memory controller 10' of memory system 100' transmits information regarding erroneous bits detected by ECC processing block 12 in a mode for selecting a read voltage to read voltage controller 26 of memory device 20'.

Thus, read voltage controller 26 in memory device 20' calculates the number of erroneous bits detected by first ECC processor 12-1 at each of the read voltage levels from data read from storage regions to which the first error correction rate is applied, and determines a read voltage level at which a minimum number of erroneous bits is calculated, out of a plurality of read voltage levels, as a reference voltage level. Also, read voltage controller 26 determines a selected read voltage based on the reference voltage level.

Figure 17:
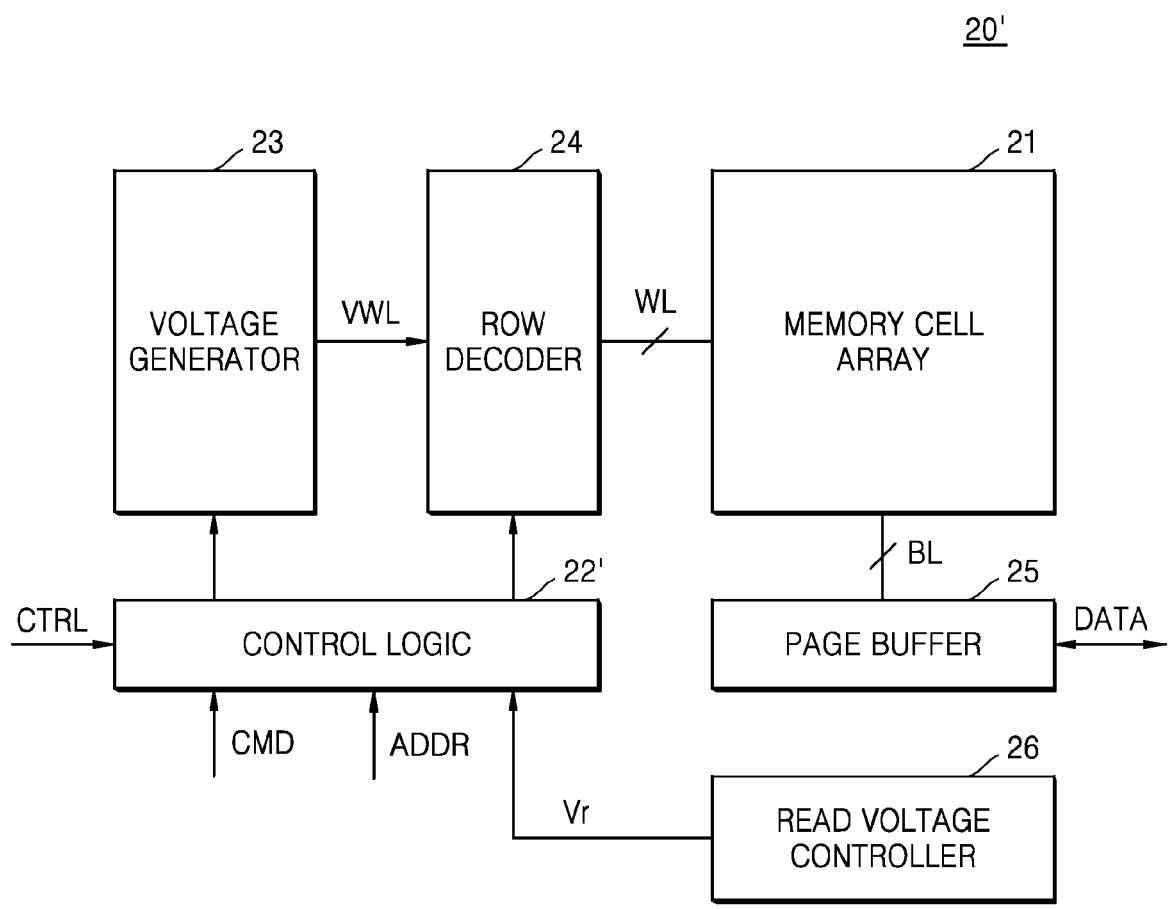
FIG. 17 is a block diagram of a memory device in the memory system of FIG. 16, according to another embodiment of the inventive concept.

FIG. 17 is a block diagram of memory device 20' in memory system 100' of FIG. 16, according to an embodiment of the inventive concept.

Referring to FIG. 17, memory device 20' comprises memory cell array 21, control logic 22', a voltage generator 23, a row decoder 24, a page buffer 25, and read voltage controller 26. Some features of memory device 20' are substantially the same as features of memory device 20 of FIG. 2. The following description will emphasize only differences between memory device 20 of FIG. 2 and memory device 20'.

Control logic 22' outputs various control signals required to write data in memory cell array 21 or read data from memory cell array 21 based on a command CMD, an address ADDR, and a control signal CTRL received from memory controller 10' or a read voltage Vr received from read voltage controller 26. A control signal output by control logic 22' is transmitted to voltage generator 23, row decoder 24, and page buffer 25.

Read voltage controller 26 controls voltage levels of read voltage Vr required to read data stored in memory cells disposed in memory cell array 21. An output of read voltage controller 26, for example, a controlled read voltage or a variation in read voltage is provided to control logic 22'. Because memory device 20' comprises read voltage controller 26, even if a threshold voltage of memory cells is changed due to external stimuli and/or wearing, memory device 20' may control a voltage level of read voltage Vr in response to the changed threshold voltage, thereby improving an RBER.

Figure 18:
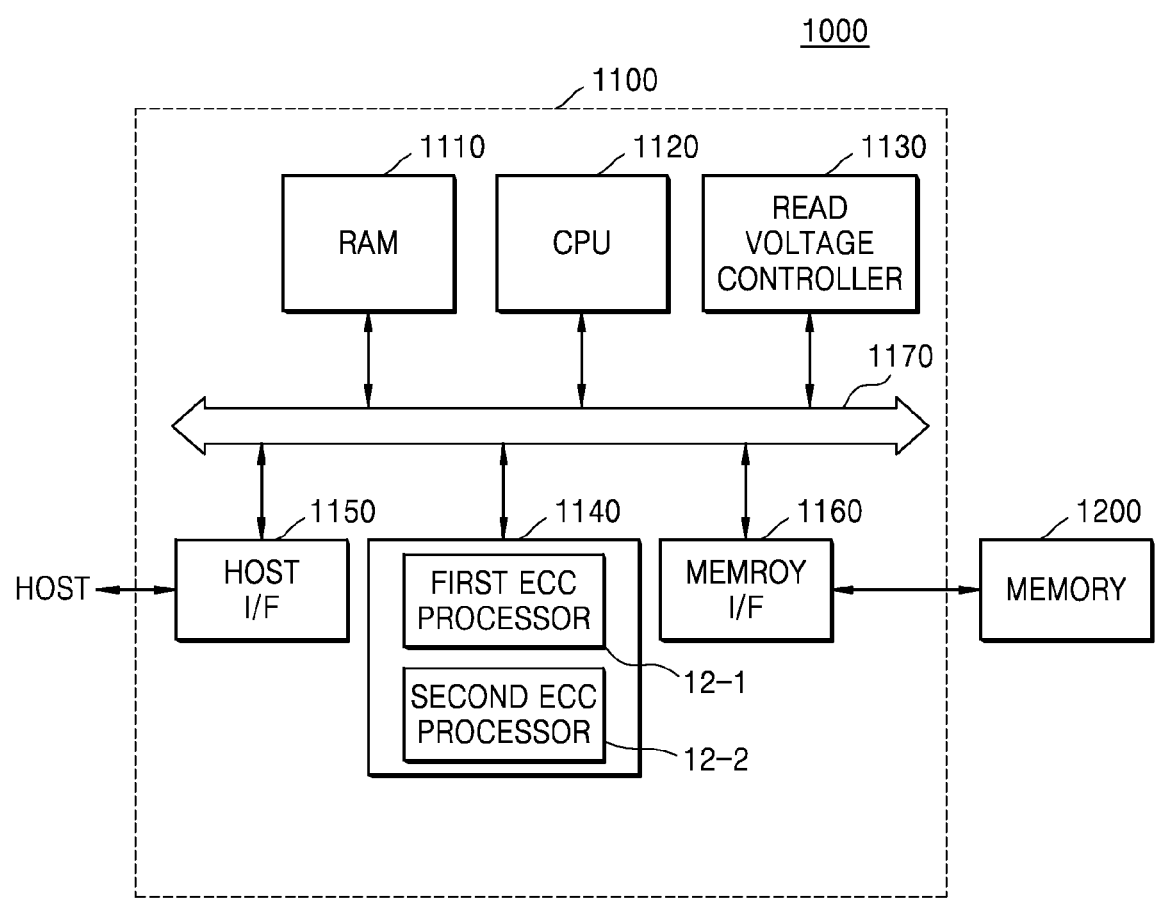
FIG. 18 is a block diagram of a memory system according to another embodiment of the inventive concept.

FIG. 18 is a block diagram of a memory system 1000 according to another embodiment of the inventive concept.

Referring to FIG. 18, memory system 1000 comprises a memory controller 1100 and a memory device 1200.

Memory device 1200 can be, for instance, a non-volatile semiconductor memory device, such as a flash memory, a PRAM, a ferroelectric RAM (FRAM), or an MRAM. Memory device 1200 can be implemented by memory device 20 of FIG. 1, for instance.

In some embodiments, where memory device 1200 is a non-volatile semiconductor memory device, such as a flash memory, memory system 1000 may be an SSD. Memory controller 1100 controls erase, write, and read operations of memory device 1200 in response to a command received from a host. Also, memory controller 1100 may control a read voltage applied to memory device 1200.

Memory controller 1100 comprises a RAM 1110, a central processing unit (CPU) 1120, a read voltage controller 1130, an ECC processing block 1140, a host interface 1150, a memory interface 1160, and a bus 1170. Bus 1170 serves as a transmission path via which data is transmitted among components of memory controller 1100.

CPU 1120 controls general operations of memory system 1000. In some embodiments, CPU 1120 controls memory system 1000 according to the command received from the host. CPU 1120 provides a read command and an address to memory device 1200 during a read operation and provides a write command, an address, and data during a write operation. Also, CPU 1120 performs an operation of converting a logical address into a physical address.

CPU 1120 controls memory system 1000 to perform an operation of executing a method of controlling a read voltage of a memory device according to an embodiment of the inventive concept. In some embodiments, CPU 1120 controls memory system 1000 to perform a method of controlling a read voltage of a memory device and a method of reading data with reference to the flowcharts shown in FIGS. 19 through 25.

Data transmitted from the host or read from memory device 1200 is temporarily stored in RAM 1110. Also, meta data read from memory device 1200 also may be stored in RAM 1110. RAM 1110 may be embodied by a dynamic random access memory (DRAM) or static RAM (SRAM).

Meta data may include information required to manage memory system 1000. The meta data serving as management information may include mapping information used to convert a logical address into a physical address of memory device 1200. Also, the meta data may include information used to determine a degree of degradation of each region of memory device 1200. Also, the meta data may include information required to manage storage operations of memory device 1200.

Host interface 1150 may implement a protocol for exchanging data with the host connected to memory system 1000 and for connecting memory system 1000 with the host. Host interface 1150 may comprise, for instance, an advanced technology attachment (ATA) interface, a serial advanced technology attachment (SATA) interface, a parallel advanced technology attachment (PATA) interface, a universal serial bus (USB) or serial attached SCSI (small computer system interface) (SAS), a small computer system interface (SCSI), an embedded multi-media card (eMMC) interface, or a Unix file system (UFS) interface. However, the inventive concept is not limited to the above-described examples. In alternative embodiments, for instance, host interface 1150 may exchange commands, addresses, and data with the host under control of CPU 1120.

Memory interface 1160 is electrically connected to memory device 1200. Memory interface 1160 exchanges commands, addresses, and data with memory device 1200 under the control of CPU 1120. Memory interface 1160 is typically configured to support a NAND flash memory or a NOR flash memory. Memory interface 1160 may be configured to selectively perform software and hardware interleave operations through a plurality of channels.

Read voltage controller 1130 has substantially the same construction as and performs substantially the same operation as read voltage controller 11 of FIG. 1, so a repeated description thereof is omitted. Also, ECC processing block 1140 has substantially the same construction as and performs substantially the same operation as ECC processing block 12 of FIG. 1, so a repeated description thereof is omitted. Although read voltage controller 1130 is disposed in memory controller 1100 in memory system 1000 shown in FIG. 18, read voltage controller 1130 may be disposed in memory device 1200 in memory system 1000 according to another embodiment of the inventive concept.

Methods of controlling a read voltage of a memory device and reading data, which are performed by memory system 1000 using a control operation of CPU 1120, will now be described in detail with reference to FIGS. 19 through 25.

Figure 19:
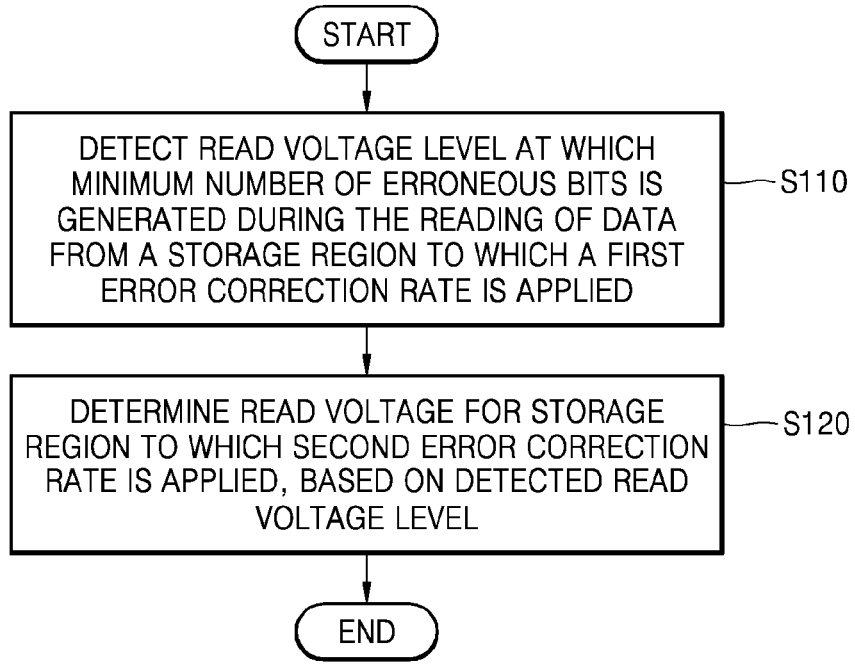
FIG. 19 is a flowchart illustrating a method of controlling a read voltage of a memory device, according to an embodiment of the inventive concept.

FIG. 19 is a flowchart illustrating a method of controlling a read voltage of a memory device, according to an embodiment of the inventive concept. CPU 1120 controls memory system 1000 to detect a read voltage level at which a minimum number of erroneous bits is generated during the reading of data from a storage region of memory device 1200 to which a first error correction rate is applied (S110). The storage region to which the first error correction rate is applied comprises a storage region in which meta data is stored. In some embodiments, by sequentially changing the read voltage level and applying each read voltage level to memory device 1200, the number of erroneous bits detected by first ECC processor 12-1 from the data read from the storage region to which the first error correction rate is applied may be calculated, and a read voltage level at which the calculated number of erroneous bits is minimized may be detected from a plurality of read voltage levels.

In some embodiments, where the correction of errors fails during the reading of data from memory device 1200, CPU 1120 controls memory system 1000 to detect a read voltage level at which a minimum number of erroneous bits is generated by correcting errors in a storage region to which the first error correction rate is applied, which is in a page that has failed in correcting errors.

In some embodiments, where the correction of errors fails during the reading of data from memory device 1200, CPU 1120 controls memory system 1000 to detect a read voltage level at which a minimum number of erroneous bits is generated by correcting errors in a storage region to which the first error correction rate is applied, which is in another page of a block including the page that has failed in correcting errors.

CPU 1120 controls memory system 1000 to determine a read voltage for a storage region to which a second error correction rate is applied, based on the read voltage level detected in operation S110 (S120). In some embodiments, CPU 1120 executes a process of searching for a valley between distributions of two adjacent states of a memory cell within a voltage level initially set based on the reference voltage level, and determines a voltage level corresponding to the found valley as a read voltage.

In some embodiments, the read voltage level detected in operation S110 is determined as a read voltage for the storage region to which the second error correction rate is applied. In some other embodiments, by applying the reference voltage level detected in operation S110 as the read voltage, data may be read from the storage region of memory device 1200 to which the second error correction rate is applied, and an ECC decoding operation may be performed on the read data. Where the correction of errors succeeds, the reference voltage level may be determined as a read voltage.

In some embodiments, where a memory cell MCEL of memory device 1200 is a single-level cell, CPU 1120 selects one read voltage in the above-described manner. In some other embodiments, where a memory cell MCEL of memory device 1200 is a multi-level cell, CPU 1120 sequentially selects a plurality of read voltages required to read data in units of logical pages from a plurality of logical pages constituting one physical page in the above-described manner.

Figure 20:
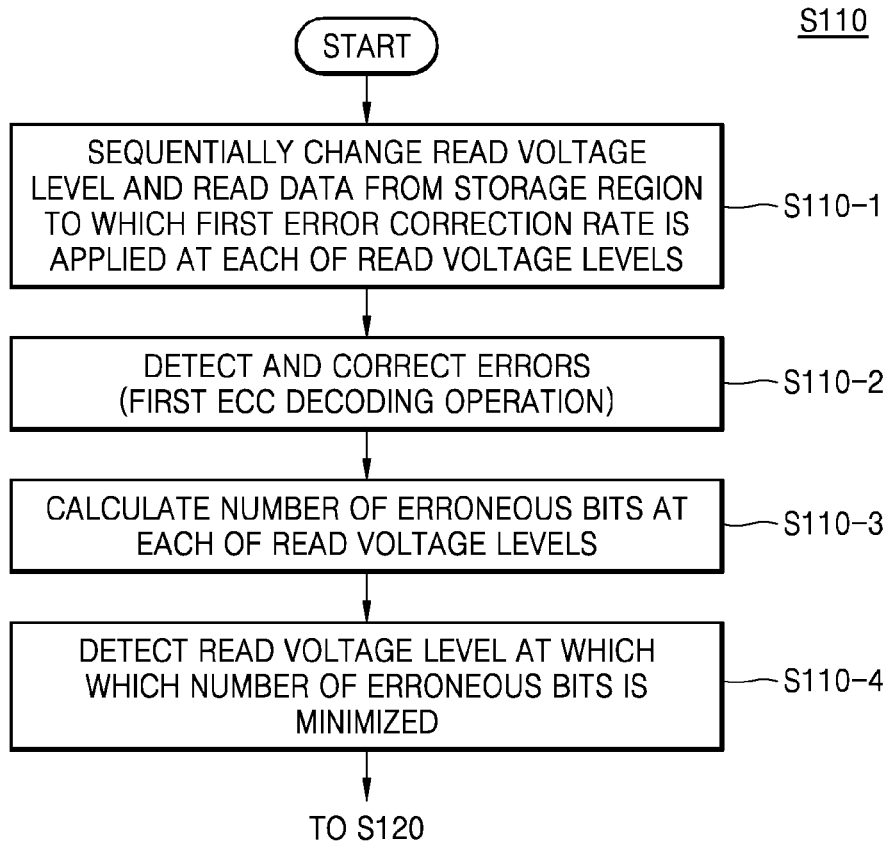
FIG. 20 is a flowchart illustrating an operation for detecting a read voltage level at which a minimum number of erroneous bits is generated in the method of FIG. 19, according to an embodiment of the inventive concept.

FIG. 20 is a flowchart illustrating operation S110 of detecting a read voltage level at which a minimum number of erroneous bits is generated of FIG. 19, according to an embodiment of the inventive concept.

CPU 1120 controls memory system 1000 to sequentially change a read voltage level and read data at each read voltage level from a storage region to which the first error correction rate is applied (S110-1). In some embodiments, a voltage level of a read voltage to be selected may be sequentially changed and applied to memory device 1200, and data may be read at each read voltage level from a storage region of memory device 1200 to which the first error correction rate is applied.

In another example, CPU 1120 controls memory system 1000 to read part of data stored in a storage region of memory device 1200 to which the first error correction rate is applied. In another example, CPU 1120 controls memory system 1000 to read only part of data stored in a storage region to which the first error correction rate is applied, which is in a page that has failed in correcting errors. In another example, CPU 1120 controls memory system 1000 to read all or part of meta data stored in the storage region to which the first error correction rate is applied, which is in a page that has failed in correcting errors. In another example, CPU 1120 controls memory system 1000 to read all data stored in a storage region to which the first error correction rate is applied and a storage region to which the second error correction rate is applied, which are in one page that has failed in correcting errors, and store the read data in a page buffer of memory device 1200.

In some embodiments, where a memory cell MCEL of memory device 1200 is a multi-level cell, CPU 1120 may sequentially change a plurality of read voltages required to read data in units of logical pages from a plurality of logical pages constituting one physical page in a predetermined order. Accordingly, by applying each of the read voltage levels to one read voltage to be selected, out of the read voltages, data may be read from the storage region of memory device 1200 to which the first error correction rate is applied.

In some embodiments, where a plurality of read voltages is required to read data from one logical page, CPU 1120 changes one read voltage to be selected, out of the read voltages, and fixes the remaining read voltages. Accordingly, by applying each of the read voltage levels to one read voltage to be selected, out of a plurality of read voltages required to read data from one logical page, data may be read from the storage region of memory device 1200 to which the first error correction rate is applied.

In some embodiments, a memory cell MCEL is a 3-bit multi-level cell programmed with 3 bits and performs each of an LSB read operation READ1, a CSB read operation READ2, and an MSB read operation READ3 as shown in FIGS. 10A through 10C. With the fifth read voltage Vr5 fixed during the LSB read operation READ1, CPU 1120 controls a read voltage level such that a level of first read voltage Vr1 to be selected is sequentially changed and applied to memory device 20, and it reads data from the first group of storage regions of memory device 20.

Next, with first read voltage Vr1 fixed during the LSB read operation READ1, CPU 1120 controls a read voltage level such that a level of first read voltage Vr5 to be selected is sequentially changed and applied to memory device 20, and it reads data from the first group of storage regions of memory device 20.

In the above-described manner, while controlling the read voltage level such that a read voltage to be selected is changed even during the CSB read operation READ2 and the MSB read operation READ3 and applied to memory device 20, data may be read from the first group of storage regions of memory device 20.

Next, CPU 1120 controls memory system 1000 to apply each of the read voltage levels of a read voltage to be selected such that first ECC processor 12-1 of ECC processing block 1140 performs error detection/correction operations on data read from the first group of storage regions of memory device 20 (S110-2).

Next, CPU 1120 controls memory system 1000 to calculate the number of erroneous bits at each of the read voltage levels of the read voltage to be selected (S110-3). Next, CPU 1120 controls memory system 1000 to detect a read voltage level at which the number of erroneous bits is minimized, out of the numbers of erroneous bits calculated at the respective read voltage levels of the read voltage to be selected (S110-4).

Figure 21:
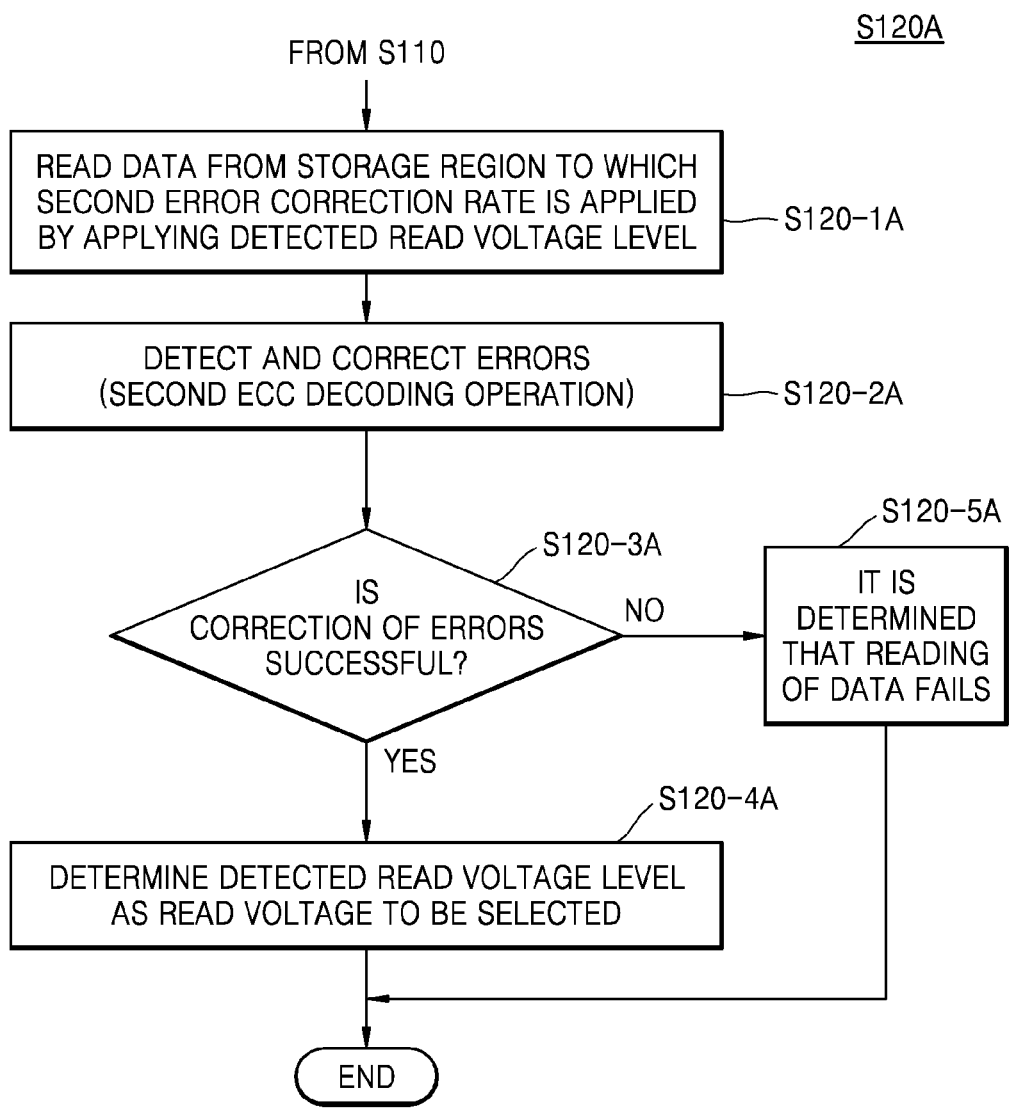
FIG. 21 is a flowchart illustrating an operation for determining a read voltage for storage regions to which a second error correction rate is applied in the method of FIG. 19, according to an embodiment of the inventive concept.

FIG. 21 is a flowchart illustrating an example of operation S120, which is used to determine a read voltage for storage regions to which a second error correction rate is applied of FIG. 19, according to an embodiment of the inventive concept.

Referring to FIG. 21, CPU 1120 controls memory system 1000 to apply the read voltage level of the read voltage to be selected, which is detected in operation S110, and read data from a storage region of memory device 1200 to which the second error correction rate is applied (S120-1A).

In some embodiments, where memory cell MCEL of memory device 1200 is a multi-level cell, detected read voltage levels corresponding respectively to a plurality of read voltages required to read data in units of logical pages are applied to memory device 1200 so that data can be read from the storage region to which the second error correction rate is applied. In some embodiments, by applying the read voltage level detected in operation S110, data may be read from a logical page to which the second error correction rate is applied, which has failed in correcting errors prior to a read voltage selection operation.

CPU 1120 controls memory system 1000 such that second ECC processor 12-2 of ECC processing block 1140 performs error detection/correction operations on the data read in operation S120-1A (S120-2A). CPU 1120 controls memory system 1000 to determine whether correction of errors is successful as the result of the error detection/correction operations S120-2A (S120-3A).

If it is determined in operation S120-3A that correction of the errors is successful, CPU 1120 controls memory system 1000 to determine the read voltage level detected in operation S110 as a read voltage to be selected (S120-4A). Otherwise, if it is determined in operation S120-3A that the correction of the errors fails, CPU 1120 may control memory system 1000 to determine that the reading of data fails (S120-5A).

FIG. 22 is a flowchart illustrating an example of operation S120 of determining the read voltage for the storage regions to which the second error correction rate is applied of FIG. 19, according to another embodiment of the inventive concept.

Referring to FIG. 22, CPU 1120 controls memory system 1000 to perform an operation of searching for a valley between distributions of two adjacent states of a memory cell within an initially set voltage range based on the read voltage level of the read voltage to be selected, which is detected in operation S110 (S120-1B). In some embodiments, a point at which the number of memory cells present in each of sections divided by two adjacent voltage levels is minimized may be decided as the valley.

CPU 1120 controls memory system 1000 to determine a voltage level corresponding to the valley found in operation S120-1B as a read voltage to be selected (S120-2B).

FIG. 23 is a flowchart illustrating operation S120-1B of searching for a valley between distributions of two adjacent states of a memory cell of FIG. 22, according to an embodiment of the inventive concept.

Referring to FIG. 23, CPU 1120 controls memory system 1000 to calculate the number of memory cells present in each of sections divided based on the read voltage level of the read voltage to be selected, which is detected in operation S110 (S120-1B1). In some embodiments, the number of memory cells present in each of a plurality of sections divided by a plurality of voltage levels within the initially set voltage range based on the detected read voltage level may be counted.

CPU 1120 controls memory system 1000 to calculate a valley between distributions based on the number of memory cells of each of the sections, which is calculated in operation S120-1B1 (S120-1B2). In some embodiments, a point at which the decreasing number of memory cells present in each of the sections starts to increase may be determined as the valley. In some embodiments, a middle point of a section in which the number of memory cells present in each of the sections decreases and then increases may be determined as the valley.

Figure 24:
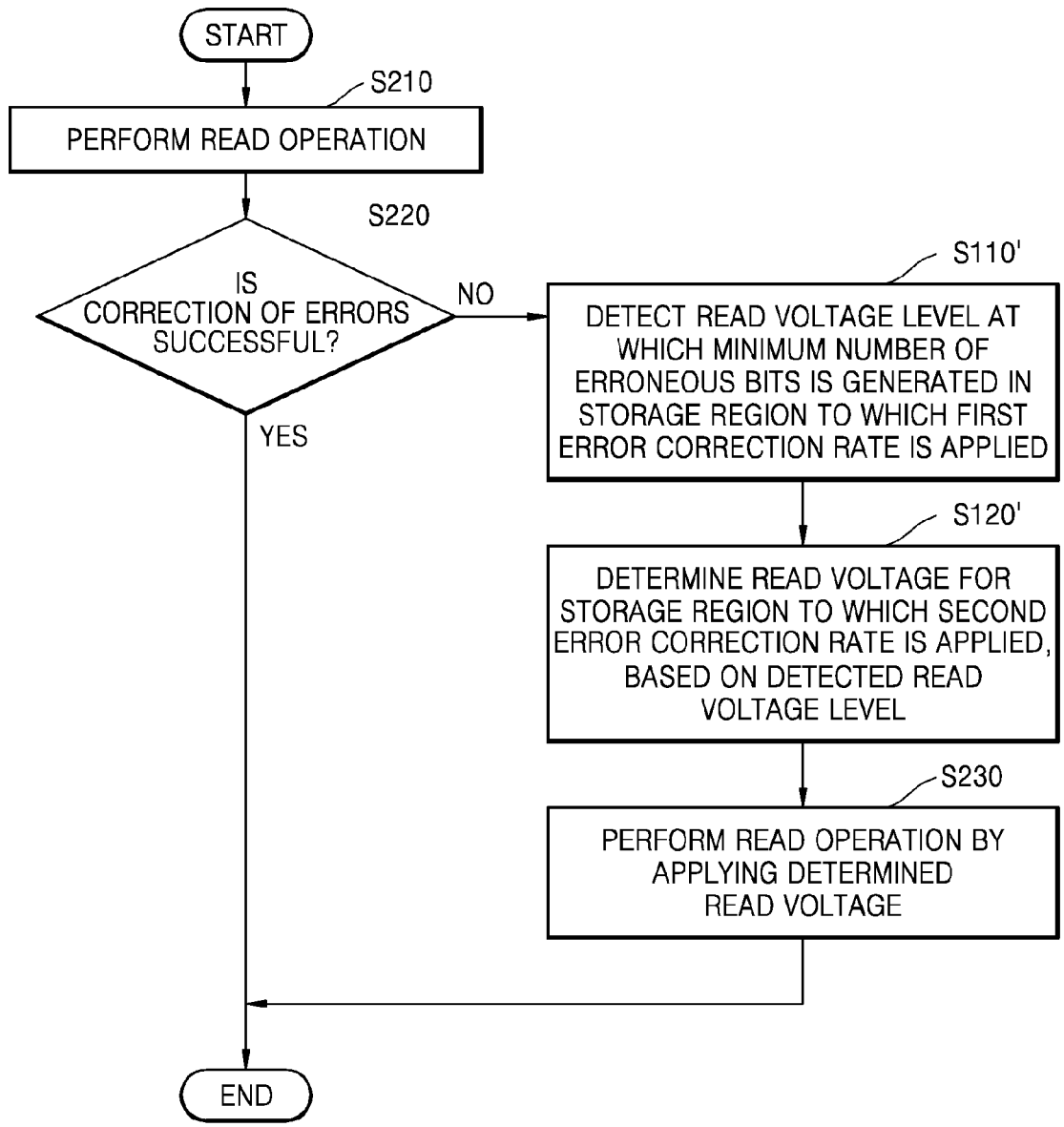
FIG. 24 is a flowchart illustrating a method of reading data, according to an embodiment of the inventive concept.

FIG. 24 is a flowchart illustrating a method of reading data, according to an embodiment of the inventive concept.

Referring to FIG. 24, CPU 1120 controls memory system 1000 to perform a read operation at a host's request (S210). In some embodiments, CPU 1120 controls memory system 1000 such that during the read operation, first ECC processor 12-1 performs an ECC decoding operation on data read from the first group of storage regions in which meta data is stored, and second ECC processor 12-2 performs an ECC decoding operation on data read from the second group of storage regions in which user data is stored. The first error correction rate may be higher than the second error correction rate.

CPU 1120 controls memory system 1000 to determine whether correction of errors is successful during the ECC decoding operation of the read operation (S220). If it is determined that correction of the errors is successful during the ECC decoding operation of the read operation, CPU 1120 may end the read operation.

Otherwise, if it is determined that the correction of the errors fails during the ECC decoding operation of the read operation, CPU 1120 controls memory system 1000 to detect a read voltage level at which a minimum number of erroneous bits is generated by correcting errors in a storage region of memory device 1200 to which the first error correction rate is applied (S110'). In some embodiments, CPU 1120 controls memory system 1000 to read data from a first group of storage regions and a second group of storage regions, which are in a page that has failed in correcting errors, load the data in the page buffer of memory device 1200, and detect a read voltage level at which a minimum number of erroneous bits is generated in the data stored in the first group of storage regions, which is loaded in the page buffer. CPU 1120 may control memory system 1000 to determine a read voltage for the storage region to which the second error correction rate is applied, based on the read voltage level detected in operation S110' (S120').

Operations S110' and S120' described in the flowchart of FIG. 24 are substantially the same as operations S110 and S120 described with respect to the flowchart of FIG. 19, so a repeated description thereof is omitted. Next, CPU 1120 controls memory system 1000 to apply the read voltage determined in operation S120' and perform a read operation (S230).

Figure 25:
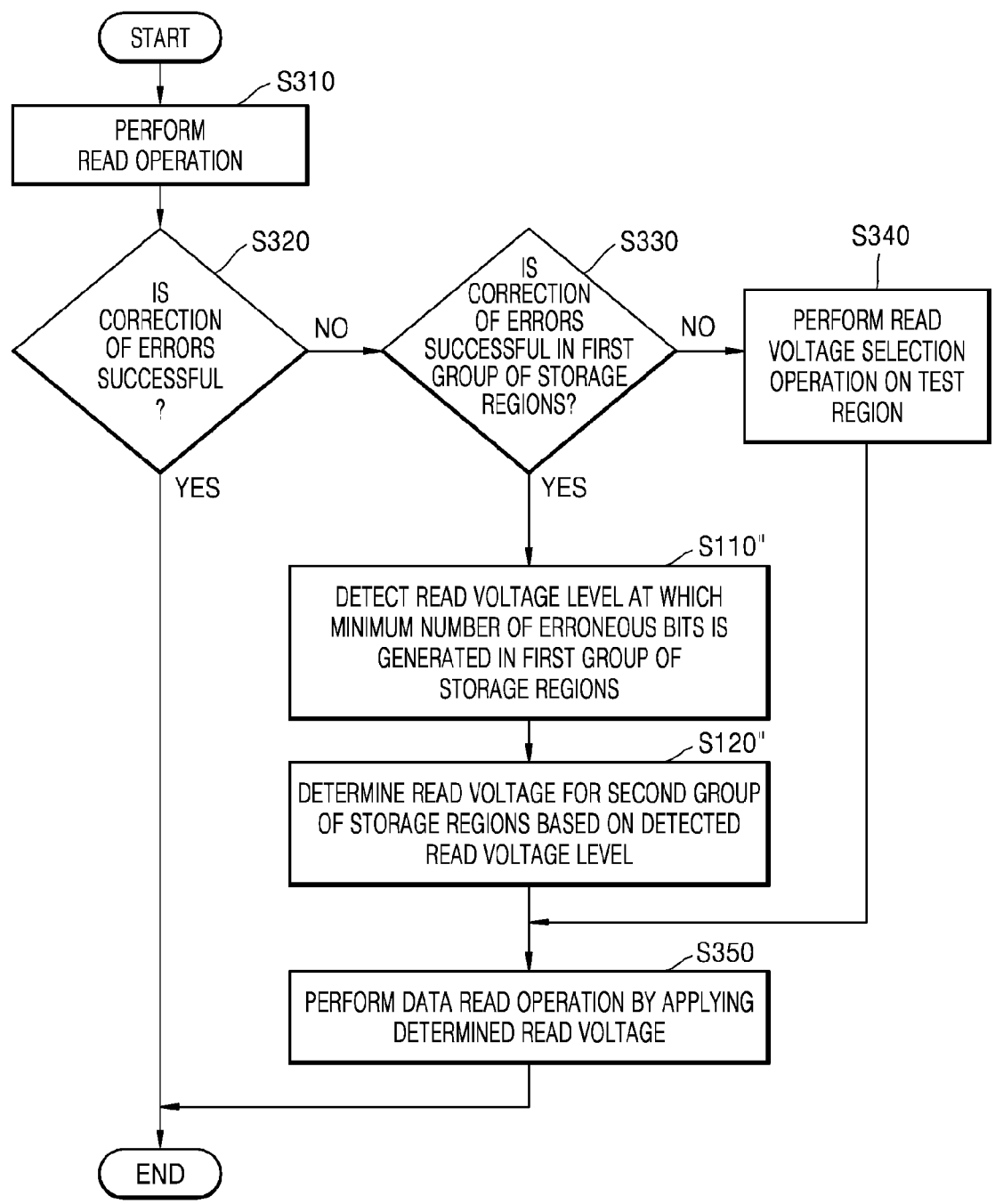
FIG. 25 is a flowchart illustrating a method of reading data, according to another embodiment of the inventive concept.

FIG. 25 is a flowchart illustrating a method of reading data, according to another embodiment of the inventive concept.

CPU 1120 may control memory system 1000 to perform a read operation at a host's request (S310). In some embodiments, CPU 1120 may control memory system 1000 such that during the read operation, first ECC processor 12-1 performs an ECC decoding operation on data read from a first group of storage regions in which meta data is stored, and second ECC processor 12-2 performs an ECC decoding operation on data read from a second group of storage regions in which user data is stored. As mentioned above, the first error correction rate may be higher than the second error correction rate.

CPU 1120 may control memory system 1000 to determine whether correction of errors is successful during the ECC decoding operation of the read operation (S320). If it is determined that correction of the errors is successful during the ECC decoding operation of the read operation, CPU 1120 may end the read operation.

Otherwise, if it is determined that the correction of the errors fails during the ECC decoding operation of the read operation, CPU 1120 may determine whether correction of errors is successful in the first group of storage regions of memory device 1200 to which the first error correction rate is applied (S330). In some embodiments, CPU 1120 determines whether correction of errors is successful during the reading of meta data from a first group of storage regions in a page that has been requested to read data.

If it is determined in operation S330 that correction of the errors is successful in the first group of storage regions, CPU 1120 controls memory system 1000 to detect a reference voltage level at which a minimum number of error bits is generated by correcting errors in a storage region of memory device 1200 to which the first error correction rate is applied (S110").

CPU 1120 may control memory system 1000 to determine a read voltage for a storage region to which the second error correction rate is applied, based on the reference voltage level detected in operation S110" (S120").

Since operations S110" and S120" described with respect to the flowchart of FIG. 25, which illustrates a method of reading data, are substantially the same as operations S110 and S120 described with respect to the flowchart of FIG. 19, which illustrates a method of controlling a read voltage of a memory device, a repeated description thereof is omitted.

Otherwise, if it is determined in operation S330 that the correction of the errors fails in the first group of storage regions, CPU 1120 may control memory system 1000 to perform a read voltage selection operation on a test region of memory device 1200 (S340). The test region of memory device 1200 may include the region Mon shown in FIG. 9. The read voltage selection operation may be performed on the test region using a known method of detecting a cell shift level.

Next, CPU 1120 may control memory system 1000 to apply the read voltage determined in operation S120" or operation S340 and perform a read operation (S350).

Figure 26:
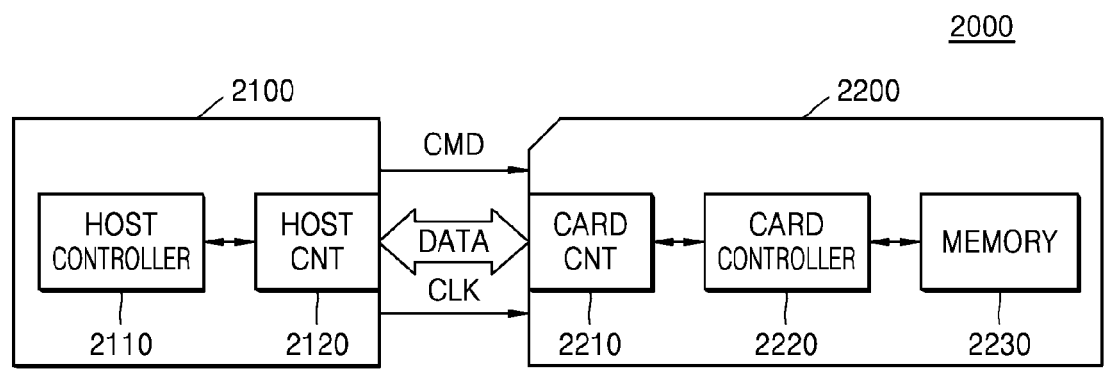
FIG. 26 is a block diagram of a memory card incorporating a memory system, according to an embodiment of the inventive concept.

FIG. 26 is a block diagram of a memory card comprising a memory system according to an embodiment of the inventive concept.

Referring to FIG. 26, a memory card system 2000 comprises a host 2100 and a memory card 2200. Host 2100 comprises a host controller 2110 and a host connector 2120. Memory card 2200 comprises a card connector 2210, a card controller 2220, and a memory device 2230. Host 2100 writes data in memory card 2200 or read data stored in memory card 2200. Host controller 2110 transmits a command CMD, a clock signal CLK generated by a clock generator (not shown) of host 2100, and data DATA to memory card 2200 through host connector 2120.

Card controller 2220 stores data in memory device 2230 in synchronization with a clock signal CLK generated by a clock generator (not shown) of card controller 2220 in response to a command received through card connector 2210. Memory device 2230 stores data transmitted from host 2100. In this case, card controller 2220 or memory device 2230 comprises read voltage controller 11, 26, or 1130 described above with reference to FIGS. 1 through 18.

Memory card 2200 can be, for instance, a compact flash card (CFC), a Microdrive, a smart media card (SMC), a multimedia card (MMC), a security digital card (SDC), a memory stick, or a universal serial bus (USB) flash memory drive.

Figure 27:
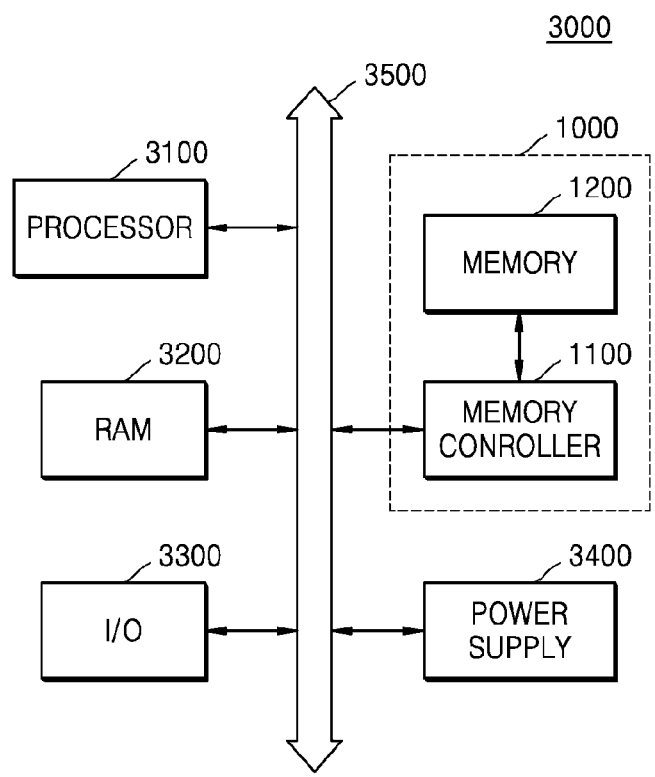
FIG. 27 is a block diagram a computing system comprising a memory system, according to an embodiment of the inventive concept.

FIG. 27 is a block diagram a computing system 3000 comprising a memory system according to an embodiment of the inventive concept.

Referring to FIG. 27, computing system 3000 comprises a processor 3100, a RAM 3200, an I/O device 3300, a power supply 3400, and a memory system 1000. Although not shown in FIG. 27, computing system 3000 may further comprise ports capable of communicating with a video card, a sound card, a memory card, and a USB apparatus or communicating with other electronic devices. Computing system 3000 may be embodied by a personal computer (PC) or a portable electronic device, such as a laptop computer, a portable phone, a personal digital assistant (PDA), or a camera.

Processor 3100 may perform specific calculations or tasks. In some embodiments, processor 3100 may be a microprocessor (MP) or a central processing unit (CPU). Processor 3100 may communicate data or signals with RAM 3200, the I/O device 3300, and memory system 1000 through a bus 3500, such as an address bus, a control bus, and a data bus. In some embodiments, processor 3100 may be connected to an expansion bus, such as a peripheral component interconnect (PCI) bus.

RAM 3200 may store data required for an operation of computing system 3000. For example, memory device 3200 may be embodied by a DRAM, a mobile DRAM, an SRAM, a PRAM, an FRAM, an RRAM, and/or an MRAM.

I/O device 3300 typically comprises an input unit, such as a keyboard, a keypad, or a mouse, and an output unit, such as a printer or a display unit. Power device 3400 may supply an operating voltage required for the operation of computing system 3000.

Figure 28:
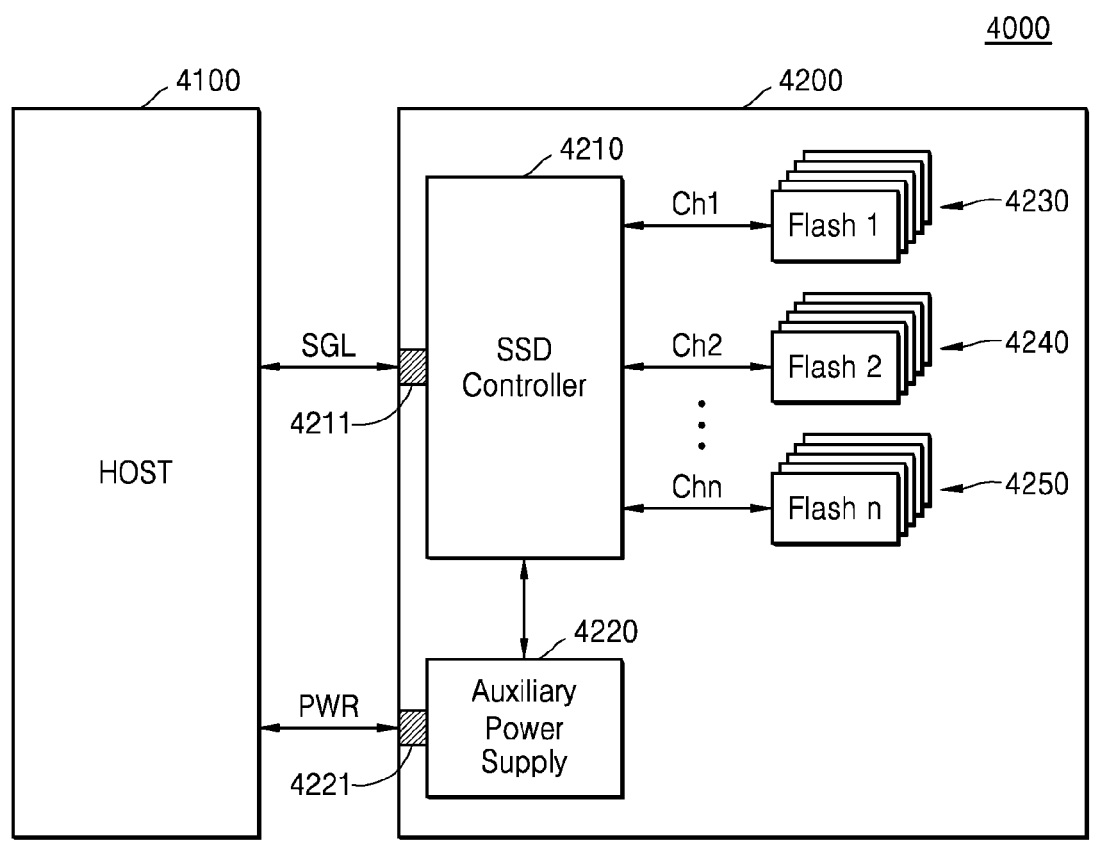
FIG. 28 is a block diagram of a solid-state drive (SSD) comprising a memory system, according to an embodiment of the inventive concept.

FIG. 28 is a block diagram of an SSD comprising a memory system according to an embodiment of the inventive concept.

Referring to FIG. 28, an SSD system 4000 comprises a host 4100 and an SSD 4200. SSD 4200 may transmit/receive signals to/from host 4100 through a signal connector 4211 and receive power through a power connector 4221. SSD 4200 comprises an SSD controller 4210, an auxiliary power supply 4220, and a plurality of memory devices 4230, 4240, and 4250. In this case, SSD controller 4210 or memory devices 4230, 4240, and 4350 comprises read voltage controller 11, 26, or 1130 described above with reference to FIGS. 1 through 18.

Figure 29:
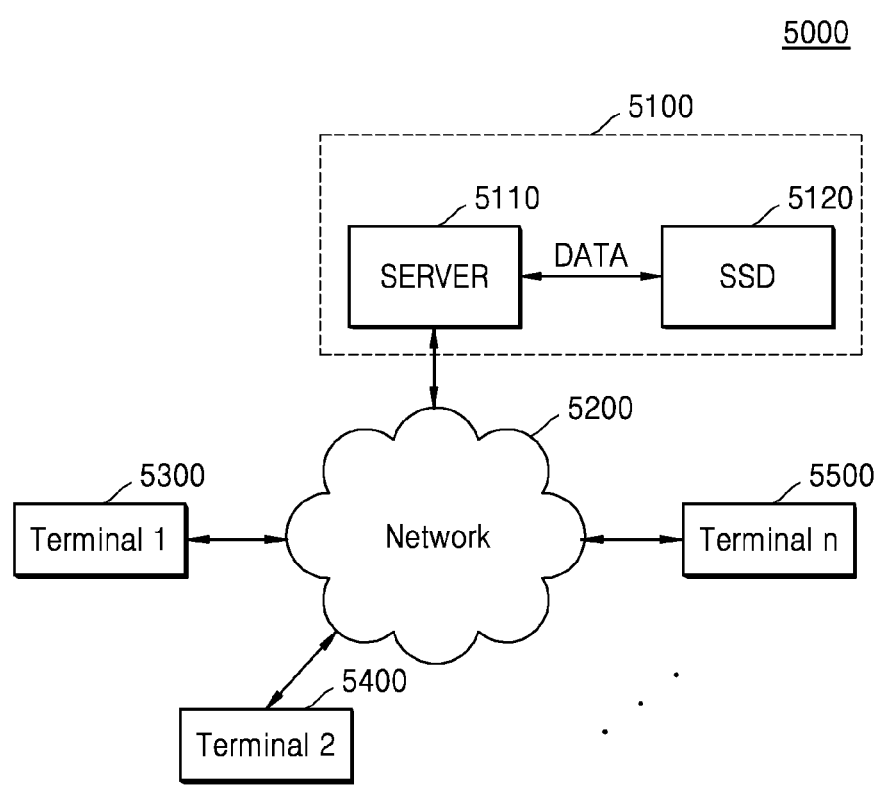
FIG. 29 is a block diagram of a server system and a network system comprising the SSD of FIG. 28, according to an embodiment of the inventive concept.

FIG. 29 is a diagram of a server system 5100 and a network system 5000 comprising SSD system 4000 of FIG. 28.

Referring to FIG. 29, network system 5000 comprises server system 5100 and a plurality of terminals 5300, 5400, and 5500 connected via a network 5200. Server system 5100 comprises a server 5110 configured to process requests received from plurality of terminals 5300, 5400, and 5500 connected to network 5200, and an SSD 5120 configured to store data corresponding to the requests received from terminals 5300, 5400, and 5500. In this case, SSD 5120 may be SSD system 4000 of FIG. 28.

The above-described memory systems, devices, and related features may be mounted using various types of packages. For example, they may be mounted in packages or package types such as Package on Packages (PoPs), Ball grid arrays (BGAs), Chip scale packages (CSPs), Plastic Leaded Chip Carriers (PLCCs), Plastic Dual In-Line Packages (PDIPs), Die in Waffle Packs, Die in Wafer Forms, Chip On Boards (COBs), Ceramic Dual In-Line Packages (CERDIPs), Plastic MetricQuad Flat Packs (MQFPs), Small Outline Integrated Circuits (SOICs), Shrink Small Outline Package(S-SOP), Thin Small Outline Package (TSOP), Thin Quad Flat-packs (TQFPs), System In Packages (SIPs), Multi Chip Packages (MCPs), Wafer-level Fabricated Packages (WFPs), or Wafer-Level Processed Stack Packages (WSPs).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of determining a read voltage of a memory device, comprising:
    performing a plurality of read operations with respective different read voltages on a first group of storage regions of the memory device using a first error correction rate by a first ECC processor, wherein the plurality of read operations are performed to distinguish between a pair of adjacent logic states of memory cells in the first group of storage regions;
    detecting a read voltage level, among the different read voltages, at which a minimum number of erroneous bits is generated in at least one read operation;
    determining a read voltage for a second group of storage regions to which a second error correction rate using a second ECC processor is applied, based on the detected read voltage level; and
    performing a read operation by the second ECC processor on the second group of storage regions using the determined read voltage,
    wherein the first error correction rate is higher than the second error correction rate, and
    wherein the first group of storage regions comprises a region in which meta data is stored.

2. The method of claim 1, wherein the memory device comprises multi-level cells, and the method further comprises:
    detecting at least one additional read voltage level, among additional different read voltages, at which a minimum number of erroneous bits is generated in at least one additional read operation performed to distinguish between another pair of adjacent logic states of memory cells in the first group of storage regions; and
    determining additional read voltages for the second group of storage regions based on the at least one detected additional read voltage level.

3. The method of claim 1, wherein the second group of storage regions comprises a region in which user data is stored.

4. The method of claim 1, wherein the memory device comprises a plurality of pages, and at least one of the pages includes the first and second groups of storage regions.

5. The method of claim 1, wherein said detecting the read voltage level comprises:
    sequentially changing the read voltage level and reading data from the first group of storage regions by applying each of the changed read voltage levels;
    determining a number of erroneous bits detected from the read data at each of the changed read voltage levels; and
    detecting the read voltage level at which the determined number of erroneous bits is minimized.

6. The method of claim 5, wherein said determining the number of erroneous bits comprises determining a number of erroneous bits in part of data read from the first group of storage regions.

7. The method of claim 1, wherein the detected read voltage level is determined as the read voltage for the second group of storage regions.

8. The method of claim 1, wherein said determining the read voltage for the second group of storage regions comprises:
- reading data from the second group of storage regions by applying the detected read voltage level;
- performing a decoding operation on the read data; and
- determining the detected read voltage level as the read voltage for the second group of storage regions where correction of errors is successful during the decoding operation.

9. The method of claim 1, wherein said determining of the read voltage for the second group of storage regions comprises:
- searching for a valley between distributions of two adjacent states of a memory cell within an initially set voltage range based on the detected read voltage level; and
- determining a voltage level corresponding to a found valley as the read voltage for the second group of storage regions.

10. The method of claim 9, wherein said searching for the valley between the distributions comprises:
- determining a number of memory cells present in each of multiple sections divided by two adjacent voltage levels within an initially set voltage level based on the detected read voltage level; and
- identifying the found valley according to the number of memory cells present in each of the multiple sections.

11. A method of reading data from a memory device, comprising:
- determining whether a failure in correction of errors occurs during a read operation performed on the memory device;
- detecting a read voltage level at which a minimum number of erroneous bits is generated due to a read operation performed on a first group of storage regions of the memory device to which a first error correction rate using a first ECC processor is applied when it is determined that the failure in correction of errors occurs;
- determining a read voltage for a second group of storage regions to which a second error correction rate using a second ECC processor is applied, based on the detected read voltage level; and
- performing a read operation on the first and second groups of storage regions of the memory device by applying the determined read voltage for the second group of storage regions,
- wherein the first error correction rate is higher than the second error correction rate, and
- wherein the first group of storage regions comprises a region in which meta data is stored.

12. The method of claim 11, wherein said detecting the read voltage level is performed under conditions in which the correction of errors fails during the read operation performed on the second group of storage regions and the correction of errors is successful during the read operation performed on the first group of storage regions.

13. The method of claim 11, wherein said detecting of the read voltage level comprises:
- sequentially changing the read voltage level and reading data from the first group of storage regions at each of the changed read voltage levels;
- determining a number of erroneous bits detected during a decoding operation performed on the read data at each of the changed read voltage levels; and
- detecting the read voltage level at which the determined number of erroneous bits is minimized.

14. A system, comprising:
- a memory device comprising a first group of storage regions and a second group of storage regions; and
- a memory controller comprising a read voltage controller configured to perform a plurality of read operations with respective different read voltages on the first group of storage regions using a first error correction rate by a first ECC processor, wherein the plurality of read operations are performed to distinguish between a pair of adjacent logic states of memory cells in the first group of storage regions, and further configured to detect a read voltage level, among the different read voltages, at which a minimum number of erroneous bits is generated in at least one read operation, and determine a read voltage for the second group of storage regions to which a second error correction rate using a second ECC processor is applied, based on the detected read voltage level, wherein the first error correction rate is higher than the second error correction rate,
- wherein the first group of storage regions comprises a region in which meta data is stored.

15. The system of claim 14, wherein the second group of storage regions comprises a region in which user data is stored.

16. The system of claim 14, wherein said detecting the read voltage level comprises:
- sequentially changing the read voltage level and reading data from the first group of storage regions by applying each of the changed read voltage levels;
- determining a number of erroneous bits detected from the read data at each of the changed read voltage levels; and
- detecting the read voltage level at which the determined number of erroneous bits is minimized.

17. The system of claim 16, wherein said determining the number of erroneous bits comprises determining a number of erroneous bits in part of data read from the first group of storage regions.

* * * * *